United States Patent
Nakazato et al.

(10) Patent No.: US 11,916,531 B2
(45) Date of Patent: Feb. 27, 2024

(54) ACOUSTIC WAVE DEVICE, FILTER, AND MULTIPLEXER

(71) Applicant: TAIYO YUDEN CO., LTD., Tokyo (JP)

(72) Inventors: Toshiharu Nakazato, Tokyo (JP); Shinji Yamamoto, Tokyo (JP); Ryouta Iwabuchi, Tokyo (JP); Naoki Takahashi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 401 days.

(21) Appl. No.: 17/364,462

(22) Filed: Jun. 30, 2021

(65) Prior Publication Data

US 2022/0038071 A1    Feb. 3, 2022

(30) Foreign Application Priority Data

Jul. 29, 2020  (JP) .................................. 2020-128156
Feb. 15, 2021  (JP) .................................. 2021-022002

(51) Int. Cl.
  *H03H 9/02*   (2006.01)
  *H03H 9/145*  (2006.01)
  *H03H 9/64*   (2006.01)

(52) U.S. Cl.
  CPC ...... *H03H 9/02102* (2013.01); *H03H 9/0211* (2013.01); *H03H 9/02015* (2013.01);
  (Continued)

(58) Field of Classification Search
  CPC ........... H03H 9/02102; H03H 9/02015; H03H 9/0211; H03H 9/02157; H03H 9/02543;
  (Continued)

(56) References Cited

U.S. PATENT DOCUMENTS

| | | | |
|---|---|---|---|
| 10,020,796 B2 | 7/2018 | Gilbert et al. | ..... H03H 9/02574 |
| 2017/0033765 A1 | 2/2017 | Moriya et al. | ..... H03H 9/02834 |

(Continued)

FOREIGN PATENT DOCUMENTS

| | | |
|---|---|---|
| JP | 2015-115870 A | 6/2015 |
| JP | 2017-034363 A | 2/2017 |

(Continued)

*Primary Examiner* — Rakesh B Patel
*Assistant Examiner* — Jorge L Salazar, Jr.
(74) *Attorney, Agent, or Firm* — Stein IP, LLC

(57) ABSTRACT

An acoustic wave device includes a support substrate, a piezoelectric layer provided over the support substrate, comb-shaped electrodes disposed on the piezoelectric layer, each of the comb-shaped electrodes including electrode fingers exciting an acoustic wave, a temperature compensation film interposed between the support substrate and the piezoelectric layer and having a temperature coefficient of an elastic constant opposite in sign to that of the piezoelectric layer, a boundary layer interposed between the support substrate and the temperature compensation film, an acoustic velocity of a bulk wave propagating through the boundary layer being higher than an acoustic velocity of a bulk wave propagating through the temperature compensation film and being lower than an acoustic velocity of a bulk wave propagating through the support substrate, and an intermediate layer interposed between the support substrate and the boundary layer and having a Q factor less than a Q factor of the boundary layer.

10 Claims, 30 Drawing Sheets

(52) U.S. Cl.
CPC .... *H03H 9/02157* (2013.01); *H03H 9/02543* (2013.01); *H03H 9/145* (2013.01); *H03H 9/6406* (2013.01)

(58) Field of Classification Search
CPC .. H03H 9/145; H03H 9/6406; H03H 9/02559; H03H 9/02834; H03H 9/02574; H03H 9/25; H03H 9/02047; H03H 9/54; H03H 9/56; H03H 9/64
USPC .................................................. 333/193–196
See application file for complete search history.

(56) References Cited

U.S. PATENT DOCUMENTS

| | | | |
|---|---|---|---|
| 2018/0159497 A1 | 6/2018 | Iwamoto et al. | .. H03H 9/02574 |
| 2019/0068161 A1* | 2/2019 | Kimura | ............. H03H 9/02866 |
| 2019/0326878 A1 | 10/2019 | Kakita et al. | ...... H03H 9/02574 |

FOREIGN PATENT DOCUMENTS

| | | | |
|---|---|---|---|
| JP | 2019-201345 A | 11/2019 | |
| WO | WO 2017/043427 A1 | 3/2017 | |

\* cited by examiner

ACOUSTIC WAVE DEVICE, FILTER, AND MULTIPLEXER

CROSS-REFERENCE TO RELATED APPLICATION

This application is based upon and claims the benefits of priorities of the prior Japanese Patent Application No. 2020-128156, filed on Jul. 29, 2020, and the prior Japanese Patent Application No. 2021-022002, filed on Feb. 15, 2021, the entire contents of which are incorporated herein by reference.

FIELD

The present disclosure relates to an acoustic wave device, a filter, and a multiplexer.

BACKGROUND

Surface acoustic wave resonators have been known as acoustic wave resonators used in communication devices such as smartphones. It is known to bond a piezoelectric layer forming the surface acoustic wave resonator to a support substrate. It is known to adjust the thickness of the piezoelectric layer to be equal to or less than the wavelength of the surface acoustic wave as disclosed in, for example, Japanese Patent Application Publication No. 2017-034363. It is known to provide, between the piezoelectric layer and the support substrate, a temperature compensation film or a low acoustic velocity film having a lower acoustic velocity than the piezoelectric layer as disclosed in, for example, Japanese Patent Application Publication Nos. 2019-201345 and 2015-115870, U.S. patent Ser. No. 10/020,796, and International Publication No. 2017/043427. It is known to provide, between the low acoustic velocity film and the support substrate, a high acoustic velocity film (a boundary layer) having a higher acoustic velocity than the piezoelectric layer as disclosed in, for example, Japanese Patent Application Publication No. 2015-115870.

SUMMARY OF THE INVENTION

Spurious emissions are reduced by providing a high acoustic velocity film (a boundary layer) between the temperature compensation film and the support substrate or between the low acoustic velocity film and the support substrate. However, it is desired to further reduce spurious emissions.

In a first aspect of the present disclosure, there is provided an acoustic wave device including: a support substrate; a piezoelectric layer provided over the support substrate; a pair of comb-shaped electrodes disposed on the piezoelectric layer, each of the pair of comb-shaped electrodes including electrode fingers that excite an acoustic wave; a temperature compensation film interposed between the support substrate and the piezoelectric layer and having a temperature coefficient of an elastic constant opposite in sign to a temperature coefficient of an elastic constant of the piezoelectric layer; a boundary layer interposed between the support substrate and the temperature compensation film, an acoustic velocity of a bulk wave propagating through the boundary layer being higher than an acoustic velocity of a bulk wave propagating through the temperature compensation film and being lower than an acoustic velocity of a bulk wave propagating through the support substrate; and an intermediate layer interposed between the support substrate and the boundary layer and having a Q factor less than a Q factor of the boundary layer.

In a second aspect of the present disclosure, there is provided a filter including the above acoustic wave device.

In a third aspect of the present disclosure, there is provided a multiplexer including the above filter.

DETAILED DESCRIPTION

Hereinafter, a description will be given of embodiments of the present disclosure with reference to the accompanying drawings.

First Embodiment

Figure 1A:
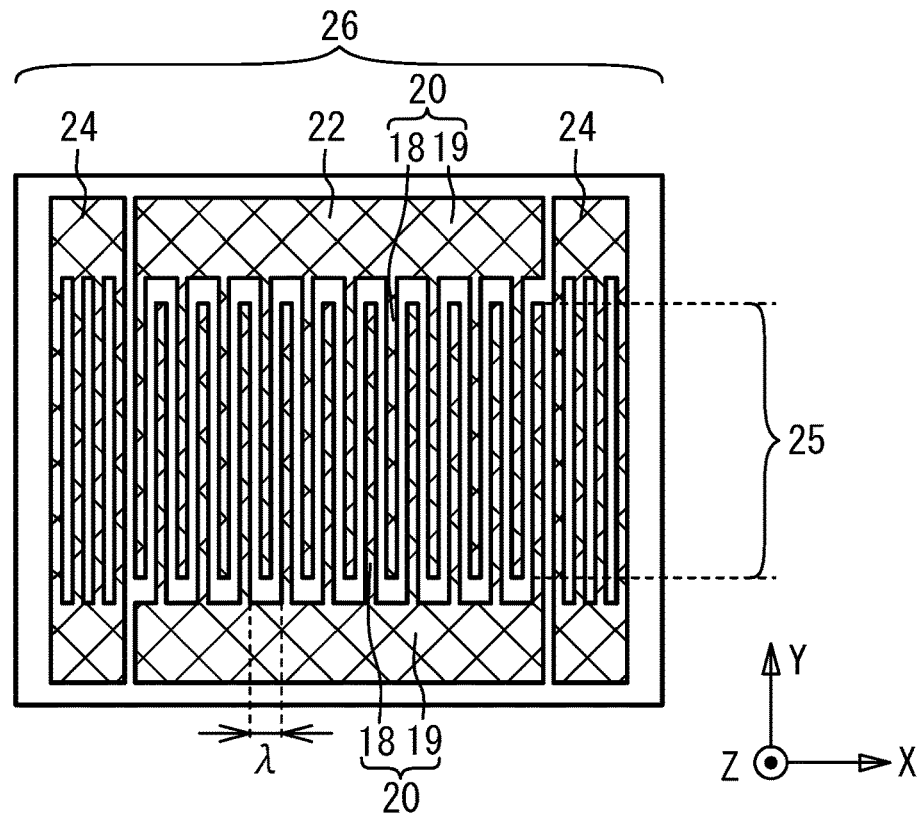
FIG. 1A is a plan view of an acoustic wave resonator in accordance with a first embodiment.
Figure 1B:
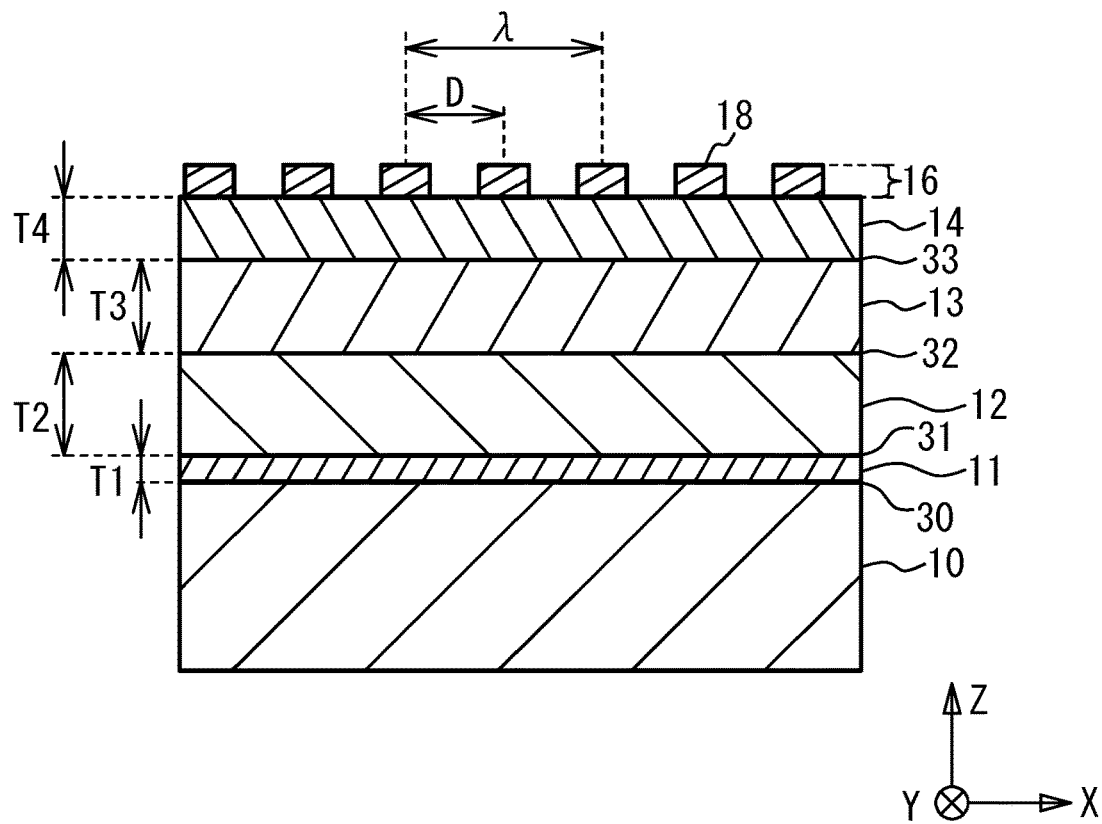
FIG. 1B is a cross-sectional view of the acoustic wave resonator in accordance with the first embodiment.

In a first embodiment, an example where an acoustic wave device has an acoustic wave resonator will be described. FIG. 1A is a plan view of an acoustic wave resonator in accordance with the first embodiment, and FIG. 1B is a cross-sectional view of the acoustic wave resonator in accordance with the first embodiment. The direction in which electrode fingers are arranged (the arrangement direction of the electrode fingers) is defined as the X direction, the direction in which the electrode finger extends (the extension direction of the electrode finger) is defined as the Y direction, and the direction in which a support substrate and a piezoelectric layer are stacked (the stack direction of the support substrate and the piezoelectric layer) is defined as the Z direction. The X direction, the Y direction, and the Z direction do not necessarily correspond to the X-axis orientation and the Y-axis orientation of the crystal orientation of the piezoelectric layer. When the piezoelectric layer is a rotated Y-cut X-propagation substrate, the X direction is an X-axis orientation of the crystal orientation.

As illustrated in FIG. 1A and FIG. 1B, a piezoelectric layer 14 is provided over a support substrate 10. A temperature compensation film 13 is interposed between the support substrate 10 and the piezoelectric layer 14. A boundary layer 12 is interposed between the temperature compensation film 13 and the support substrate 10. An intermediate layer 11 is interposed between the boundary layer 12 and the support substrate 10. The boundary face between the support substrate 10 and the intermediate layer 11 is defined as a boundary face 30, the boundary face between the intermediate layer 11 and the boundary layer 12 is defined as a boundary face 31, the boundary face between the boundary layer 12 and the temperature compensation film 13 is defined as a boundary face 32, and the boundary face between the temperature compensation film 13 and the piezoelectric layer 14 is defined as a boundary face 33. The thicknesses of the intermediate layer 11, the boundary layer 12, the temperature compensation film 13, and the piezoelectric layer 14 are represented by T1, T2, T3, and T4, respectively. The thickness means the length of the substrate, the length of the layer, and the length of the film in the Z direction, which is the stack direction of the support substrate 10 and the piezoelectric layer 14.

An acoustic wave resonator 26 is disposed on the piezoelectric layer 14. The acoustic wave resonator 26 includes an interdigital transducer (IDT) 22 and reflectors 24. The reflectors 24 are located at both sides of the IDT 22. The IDT 22 and the reflectors 24 are formed of a metal film 16 on the piezoelectric layer 14.

The IDT 22 includes a pair of comb-shaped electrodes 20 opposite to each other. The comb-shaped electrode 20 includes electrode fingers 18 and a bus bar 19 to which the electrode fingers 18 are coupled. The region where the electrode fingers 18 of the pair of the comb-shaped electrodes 20 overlap with each other is an overlap region 25. The length of the overlap region 25 is an aperture length. The electrode fingers 18 of one of the comb-shaped electrodes 20 and the electrode fingers 18 of the other of the comb-shaped electrodes 20 are alternately arranged in at least a part of the overlap region 25. In the overlap region 25, an acoustic wave mainly excited by the electrode fingers 18 propagates mainly in the X direction. The pitch of the electrode fingers 18 of one of the pair of the comb-shaped electrodes 20 is approximately equal to the wavelength λ of the acoustic wave. When the pitch of the electrode fingers 18 (the pitch between the centers of the electrode fingers 18) is represented by D, the pitch of the electrode fingers 18 of one of the comb-shaped electrodes 20 is two times the pitch D. The reflectors 24 reflect the acoustic wave (the surface acoustic wave) excited by the electrode fingers 18 of the IDT 22. Therefore, the acoustic wave is confined within the overlap region 25 of the IDT 22.

The piezoelectric layer 14 is, for example, a monocrystalline lithium tantalate ($LiTaO_3$) layer or a monocrystalline lithium niobate ($LiNbO_3$) layer, and is, for example, a rotated Y-cut X-propagation lithium tantalate layer or a rotated Y-cut X-propagation lithium niobate layer.

The support substrate 10 is, for example, a sapphire substrate, a silicon substrate, or a silicon carbide substrate. The sapphire substrate is a monocrystalline or polycrystalline $Al_2O_3$ substrate. The silicon substrate is a monocrystalline or polycrystalline silicon substrate. The silicon carbide substrate is a polycrystalline or monocrystalline SiC substrate. The linear expansion coefficient in the X direction of the support substrate 10 is less than the linear expansion coefficient in the X direction of the piezoelectric layer 14. This configuration can reduce the temperature dependence of frequency of the acoustic wave resonator. When a hard material and/or a material having a high thermal conductivity is selected as the support substrate 10, the acoustic velocity of the bulk wave propagating through the support substrate 10 is higher than the acoustic velocity of the bulk wave propagating through the boundary layer 12.

The temperature compensation film 13 has a temperature coefficient of an elastic constant opposite in sign to the temperature coefficient of the elastic constant of the piezoelectric layer 14. For example, the piezoelectric layer 14 has a negative temperature coefficient of an elastic constant, while the temperature compensation film 13 has a positive temperature coefficient of an elastic constant. The temperature compensation film 13 is, for example, an additive-free silicon oxide ($SiO_2$) film or an $SiO_2$ film containing additive elements such as, but not limited to, fluorine, and is for example, an amorphous layer. This configuration can reduce the temperature coefficient of frequency of the acoustic wave resonator. When the temperature compensation film 13 is a silicon oxide film, the acoustic velocity of the bulk wave propagating through the temperature compensation film 13 is lower than the acoustic velocity of the bulk wave propagating through the piezoelectric layer 14.

In order for the temperature compensation film 13 to have a temperature compensation function, the energy of the acoustic wave of the main response is required to exist in the temperature compensation film 13 to some extent. Although the section in which the energy of the surface acoustic wave concentrates depends on the type of the surface acoustic wave, the energy of the surface acoustic wave typically concentrates in the section from the upper surface of the piezoelectric layer 14 to a depth of 2λ (λ is the wavelength of the acoustic wave), especially in the section from the upper surface of the piezoelectric layer 14 to a depth of λ. Therefore, the thickness T4 of the piezoelectric layer 14 is preferably 2λ, or less, more preferably λ or less, further preferably 0.6λ or less.

The acoustic velocity of the bulk wave propagating through the boundary layer 12 is higher than the acoustic velocity of the bulk wave propagating through the temperature compensation film 13. Therefore, the acoustic wave used as the primary mode is confined in the piezoelectric layer 14 and the temperature compensation film 13. Additionally, the acoustic velocity of the bulk wave propagating through the boundary layer 12 is lower than the acoustic velocity of the bulk wave propagating through the support substrate 10. The boundary layer 12 is, for example, polycrystalline or amorphous, and is formed of an aluminum oxide film, a silicon nitride film, or an aluminum nitride film. The boundary layer 12 may be formed by stacking a plurality of layers made of different materials.

The Q factor of the intermediate layer 11 is lower than the Q factor of the boundary layer 12. The Q factor in the dielectric material is a reciprocal of the dielectric loss tangent tan δ. The dielectric material with a low Q factor has a large propagation loss. The acoustic velocity of the bulk wave propagating through the intermediate layer 11 may be higher or lower than the acoustic velocity of the bulk wave propagating through the boundary layer 12. For example, the intermediate layer 11 and the boundary layer 12 are layers without pores, and the material of the intermediate layer 11 is a material having a less Q factor than the material of the boundary layer 12. Alternatively, for example, the intermediate layer 11 is a porous layer having pores, and the boundary layer 12 is a layer that is not porous. In this case, the material of the intermediate layer 11 may be the same as or different from the material of the boundary layer 12.

For example, a polycrystalline or amorphous inorganic insulating material can be used as the material of the intermediate layer 11. Examples of the polycrystalline or amorphous inorganic insulating material include, but are not limited to, silicon (Si), germanium (Ge), diamond, alumina ($Al_2O_3$), gallium nitride (GaN), lead zirconate titanate (PZT), zinc oxide (ZnO) or indium tin oxide (ITO), an oxide film, a nitride film, or an oxynitride film (an oxide film, a nitride film, or an oxynitride film of, for example, silicon, aluminum, hafnium, tantalum, titanium, or magnesium), carbon nanotube, or silicon oxide containing other elements (for example, SiOF, SiOC, or SiOB). For example, a porous film can be used as the material of the intermediate layer 11. For example, porous silicon, porous polysilicon, porous alumina (nanoporous alumina), or porous polyimide can be used as the porous film. The porous film may be a film formed by sputtering as illustrated in FIG. 21B and FIG. 21C. Examples of the material to be sputtered include, but are not limited to, aluminum, aluminum oxide, aluminum nitride, silicon, silicon oxide, silicon nitride, aluminum copper alloy, copper, gold, platinum, titanium, molybdenum, chrome, niobium, ITO, or PZT. For example, an organic insulating material such as resin can be used as the material of the intermediate layer 11. Examples of the resin include, but are not limited to, epoxy, a mixture of epoxy and acrylic, acrylic, a mixture of an alumina-deposited film and resin, polyimide, and glass fiber.

The metal film 16 is a film mainly composed of, for example, aluminum (Al), copper (Cu), or molybdenum (Mo). An adhesion film such as a titanium (Ti) film or a chrome (Cr) film may be provided between the electrode finger 18 and the piezoelectric layer 14. The adhesion film is thinner than the electrode finger 18. An insulating film may be provided so as to cover the electrode fingers 18. The insulating film serves as a protective film or a temperature compensation film.

The wavelength λ of the acoustic wave is, for example, 1 μm to 6 μm. When two electrode fingers 18 are defined as a pair, the number of pairs of the electrode fingers 18 is, for example, 20 to 300 pairs. The duty ratio of the IDT 22 is a value obtained by dividing the width of the electrode finger 18 by the pitch of the electrode fingers 18, and is, for example, 30% to 70%. The aperture length of the IDT 22 is, for example, 10λ to 50λ.

Table 1 lists Young's modulus, the Poisson ratio, the density, and the acoustic velocity of the bulk wave of each material. The acoustic velocity V of the bulk wave can be calculated by the following equation (1) using Young's modulus E, the Poisson ratio γ, and the density ρ.

$$V = \sqrt{\frac{E}{2\rho(1+\gamma)}} \quad (1)$$

TABLE 1

| | LT | $Al_2O_3$ | $SiO_2$ | SA | LN | Si | AlN | SiN | SiC |
|---|---|---|---|---|---|---|---|---|---|
| Young's modulus [Gpa] | 254 | 164 | 77 | 470 | 177 | 170 | 290 | 250 | 748 |
| Poisson ratio | 0.21 | 0.24 | 0.25 | 0.25 | 0.21 | 0.28 | 0.24 | 0.23 | 0.45 |
| Density [kg/m³] | 7450 | 3150 | 2270 | 3970 | 4640 | 2329 | 3260 | 3100 | 3216 |
| Acoustic velocity of the bulk wave [m/s] | 3754 | 4582 | 3684 | 6882 | 3970 | 5340 | 5989 | 5726 | 8956 |

In Table 1, LT is monocrystalline lithium tantalate, $Al_2O_3$ is polycrystalline aluminum oxide, $SiO_2$ is amorphous silicon oxide, and SA is sapphire (monocrystalline aluminum oxide). LN is monocrystalline lithium niobate, Si is polycrystalline silicon, AlN is polycrystalline aluminum nitride, SiN is polycrystalline silicon nitride, and SiC is polycrystalline silicon carbide.

As presented in Table 1, when a lithium tantalate substrate or a lithium niobate substrate is used as the piezoelectric layer 14, and a silicon oxide film is used as the temperature compensation film 13, the acoustic velocity of the bulk wave propagating through the temperature compensation film 13 is lower than the acoustic velocity of the bulk wave propagating through the piezoelectric layer 14. When an aluminum oxide film, an aluminum nitride film, or a silicon nitride film is used as the boundary layer 12, the acoustic velocity of the bulk wave propagating through the boundary layer 12 is higher than the acoustic velocity of the bulk wave propagating through the temperature compensation film 13. When a sapphire substrate or a silicon carbide substrate is used as the support substrate 10, the acoustic velocity of the bulk wave propagating through the support substrate 10 is higher than the acoustic velocity of the bulk wave propagating through the boundary layer 12. When the boundary layer 12 is formed of an aluminum oxide film, even though the support substrate 10 is a silicon substrate, the acoustic velocity of the bulk wave propagating through the support substrate 10 is higher than the acoustic velocity of the bulk wave propagating through the boundary layer 12.

First Comparative Example

Figure 2A:
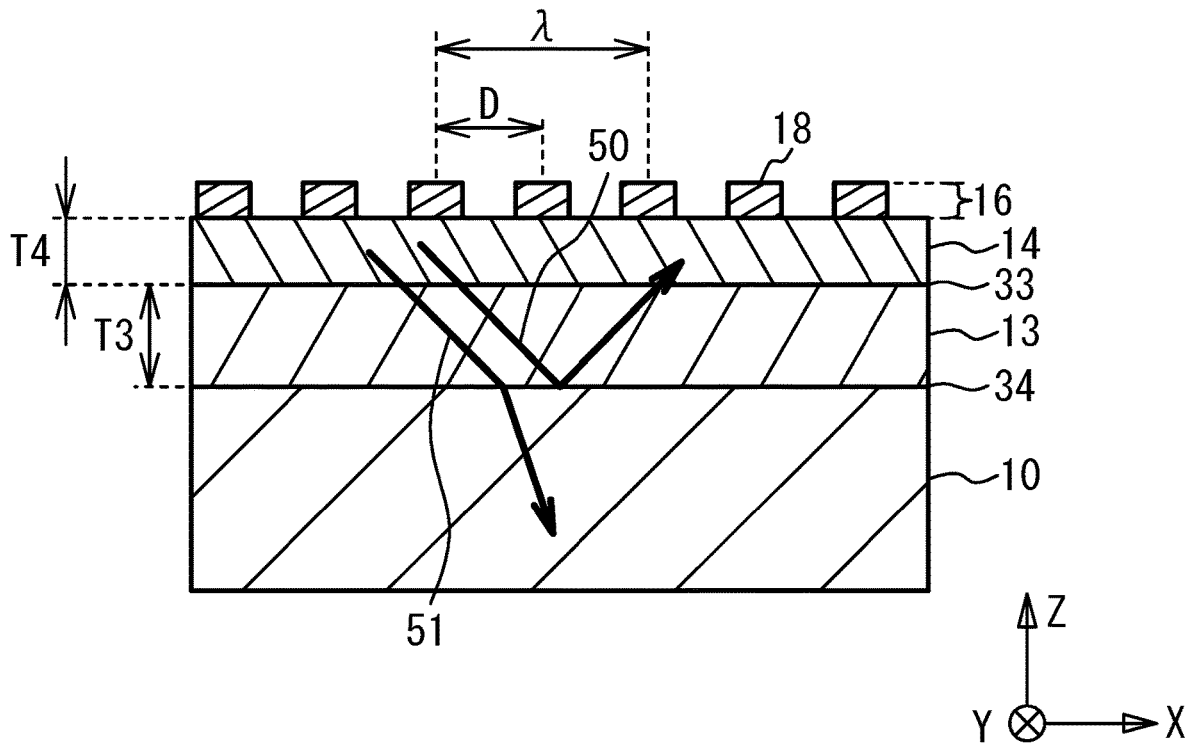
FIG. 2A is a cross-sectional view of an acoustic wave resonator in accordance with a first comparative example, and FIG. 2B schematically illustrates the transmission characteristic of the acoustic wave resonator in accordance with the first comparative example.
Figure 2B:
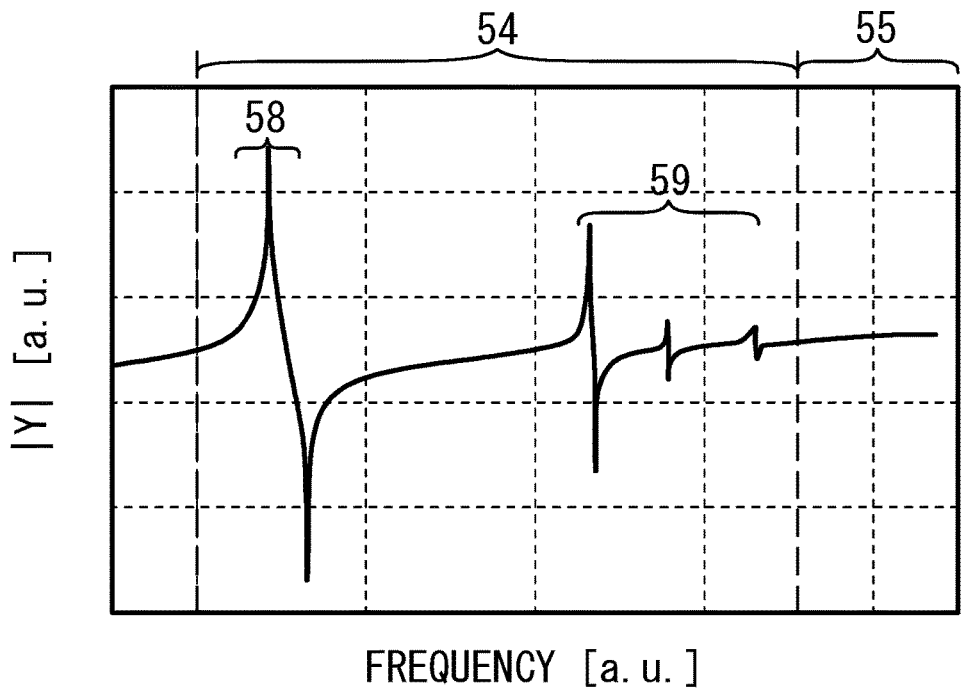

FIG. 2A is a cross-sectional view of an acoustic wave resonator in accordance with a first comparative example, and FIG. 2B schematically illustrates the transmission characteristic of the acoustic wave resonator in accordance with the first comparative example. As illustrated in FIG. 2A, in the first comparative example, neither the intermediate layer 11 nor the boundary layer 12 is provided. The acoustic velocity of the bulk wave propagating through the support substrate 10 is higher than the acoustic velocity of the bulk wave propagating through the temperature compensation film 13. Therefore, a slow acoustic wave 50 including the acoustic wave (for example, a surface acoustic wave) used as the primary mode and a bulk wave is reflected by a boundary face 34 between the temperature compensation film 13 and the support substrate 10. An acoustic wave 51 faster than the acoustic wave 50 passes through the boundary face 34.

As illustrated in FIG. 2B, a low frequency region 54 corresponding to the acoustic wave 50 includes a main response 58 and a spurious response 59 due to the bulk wave. A frequency region 55 corresponding to the acoustic wave 51 is higher in frequency than the region 54. In the first comparative example, since the acoustic wave used as the primary mode is confined in the piezoelectric layer 14 and the temperature compensation film 13, the main response 58 increases. However, the bulk wave reflected by the boundary face 34 causes the spurious response 59 (high-frequency spurious emissions).

Second Comparative Example

Figure 3A:
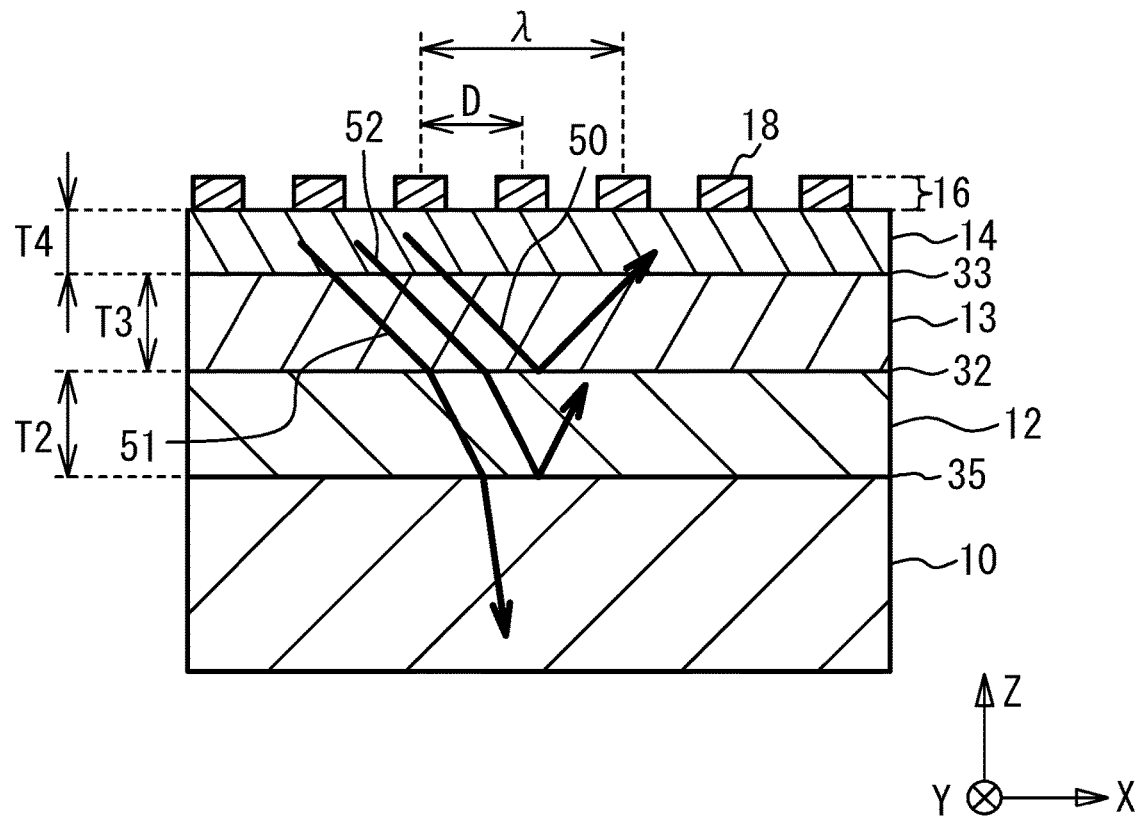
FIG. 3A is a cross-sectional view of an acoustic wave resonator in accordance with a second comparative example, and FIG. 3B schematically illustrates the transmission characteristic of the acoustic wave resonator in accordance with the second comparative example.
Figure 3B:
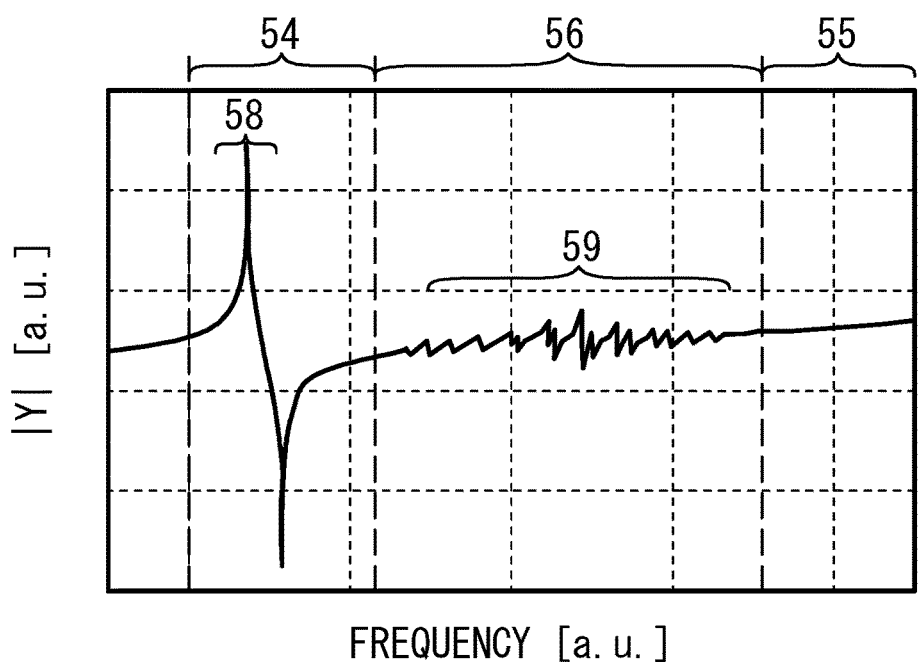

FIG. 3A is a cross-sectional view of an acoustic wave resonator in accordance with a second comparative example, and FIG. 3B schematically illustrates the transmission characteristic of the acoustic wave resonator in accordance with the second comparative example. As illustrated in FIG. 3A, in the second comparative example, no intermediate layer 11 is provided. The acoustic velocity of the bulk wave propagating through the boundary layer 12 is higher than the acoustic velocity of the bulk wave propagating through the temperature compensation film 13, and the acoustic velocity of the bulk wave propagating through the support substrate 10 is higher than the acoustic velocity of the bulk wave propagating through the boundary layer 12. Therefore, the slow acoustic wave 50 including the acoustic wave used as the primary mode is reflected by the boundary face 32 between the temperature compensation film 13 and the boundary layer 12. An acoustic wave 52 including the bulk wave faster than the acoustic wave 50 passes through the boundary face 32, and is reflected by a boundary face 35 between the boundary layer 12 and the support substrate 10. The acoustic wave 51 faster than the acoustic wave 52 passes through the boundary faces 32 and 35.

As illustrated in FIG. 3B, the low frequency region 54 corresponding to the acoustic wave 50 includes the main response 58. A frequency region 56 corresponding to the acoustic wave 52 is higher in frequency than the region 54, and includes the spurious response 59 due to the bulk wave. The frequency region 55 corresponding to the acoustic wave 51 is higher in frequency than the frequency region 56. In the second comparative example, the main response 58 is large as in the first comparative example. Additionally, the spurious response 59 is small compared with that in the first comparative example because the acoustic wave 52 including the bulk wave passes through the boundary layer 12. Since the acoustic wave 52 including the bulk wave does not leak to the support substrate 10, the loss is reduced. Although the spurious response 59 due to the bulk wave reflected by the boundary face 35 can be reduced, the spurious response 59 is not sufficiently small.

To reduce the spurious response 59 in the second comparative example, it may be considered to thicken the boundary layer 12. In addition, to scatter the acoustic wave 52 at the boundary face 35, it may be considered to roughen the boundary face 35. However, these methods increase the number of manufacturing steps and increase the difficulty level of the manufacturing process.

In the first embodiment, the sharp reflection of the acoustic wave 52 is reduced by providing the intermediate layer 11 with a low Q factor between the boundary layer 12 and the support substrate 10. As a result, spurious emissions due to the bulk wave are reduced. Since the acoustic velocity of the bulk wave propagating through the support substrate 10 is higher than the acoustic velocity of the bulk wave propagating through the boundary layer 12, the acoustic wave 52 including the bulk wave is inhibited from passing through the intermediate layer 11 and leaking to the support substrate 10. Therefore, the loss is reduced.

Simulation 1

The transmission characteristics of the first embodiment and the second comparative example were simulated. The simulation conditions are as follows.

Support substrate 10: Sapphire substrate Intermediate layer 11: Aluminum oxide layer, T1=1λ, Q=⅕₀×Q0 where Q0 represents the Q factor of the boundary layer 12.

Boundary layer 12: Aluminum oxide layer, T2=5λ

Temperature compensation film 13: Silicon oxide film, T3=0.3λ

Piezoelectric layer 14: 42° rotated Y-cut X-propagation lithium tantalate substrate, T4=0.3λ

Metal film 16: Aluminum with a thickness of 0.1λ

Wavelength λ of the acoustic wave: 5 μm

In the second comparative example, no intermediate layer 11 is provided.

The acoustic velocity of the bulk wave propagating through each material used in the simulation was configured as follows.

Figure 4A:
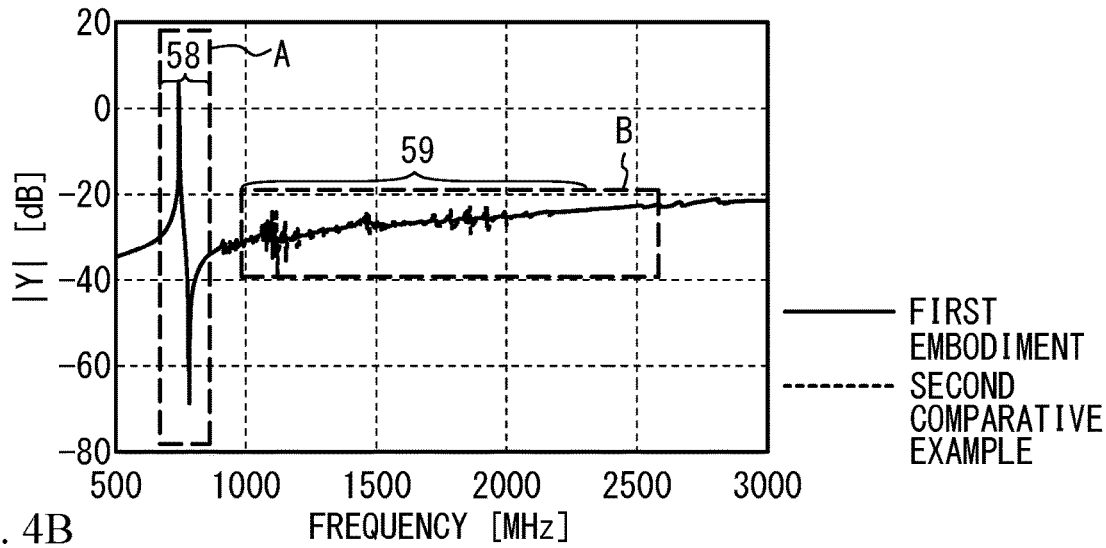
FIG. 4A to FIG. 4C illustrate the magnitude |Y| of the admittance of the first embodiment and the second comparative example with respect to frequency in a simulation 1.
Figure 4B:
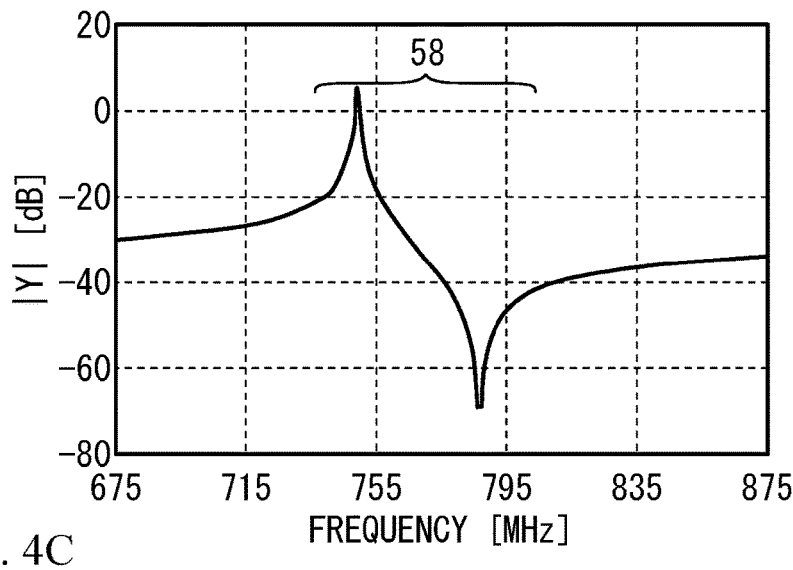
Figure 4C:
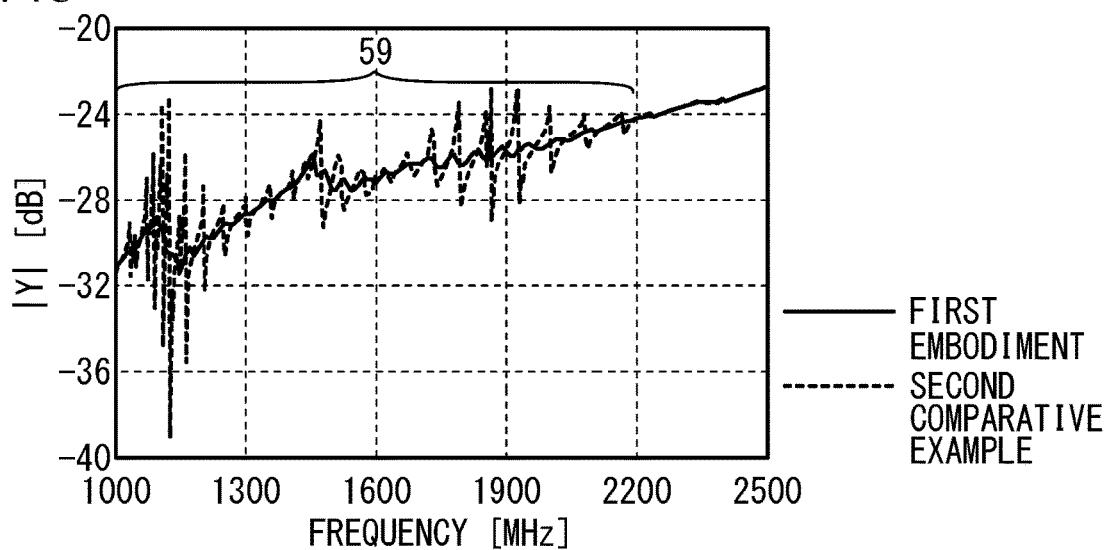

Support substrate 10: 7068.2 m/s
Intermediate layer 11: 4581.8 m/s
Boundary layer 12: 4581.8 m/s
Temperature compensation film 13: 3683.5 m/s
Piezoelectric layer 14: 3750.8 m/s FIG. 4A to FIG. 4C illustrate the magnitude |Y| of the admittance of the first embodiment and the second comparative example with respect to frequency in a simulation 1. FIG. 4B and FIG. 4C are enlarged views of ranges A and B in FIG. 4A, respectively. As illustrated in FIG. 4A and FIG. 4B, the magnitude of the main response 58 of the first embodiment is approximately equal to that of the second comparative example. As illustrated in FIG. 4A and FIG. 4C, the magnitude of the spurious response 59 of the first embodiment is smaller than that of the second comparative example.

Figure 5A:
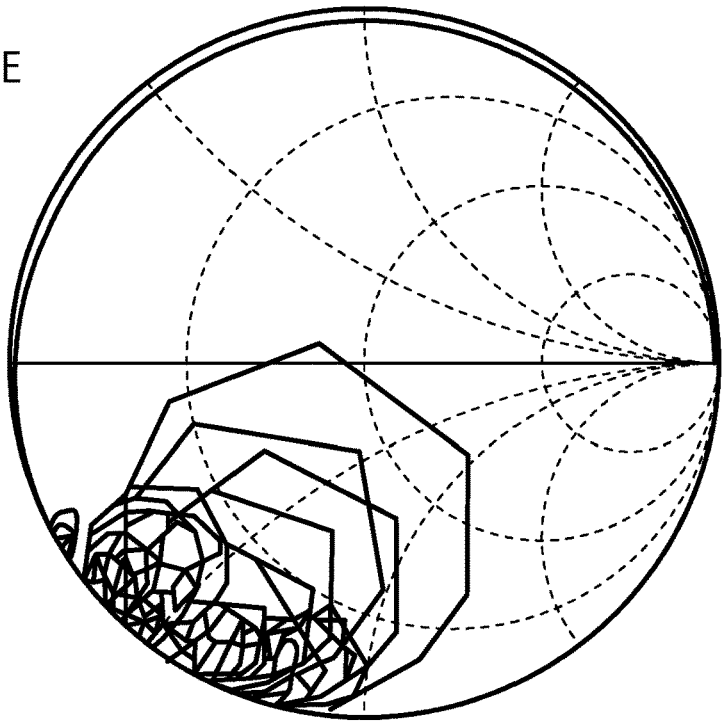
FIG. 5A and FIG. 5B are Smith charts of the impedance of the second comparative example and the first embodiment in the simulation 1, respectively.
Figure 5B:
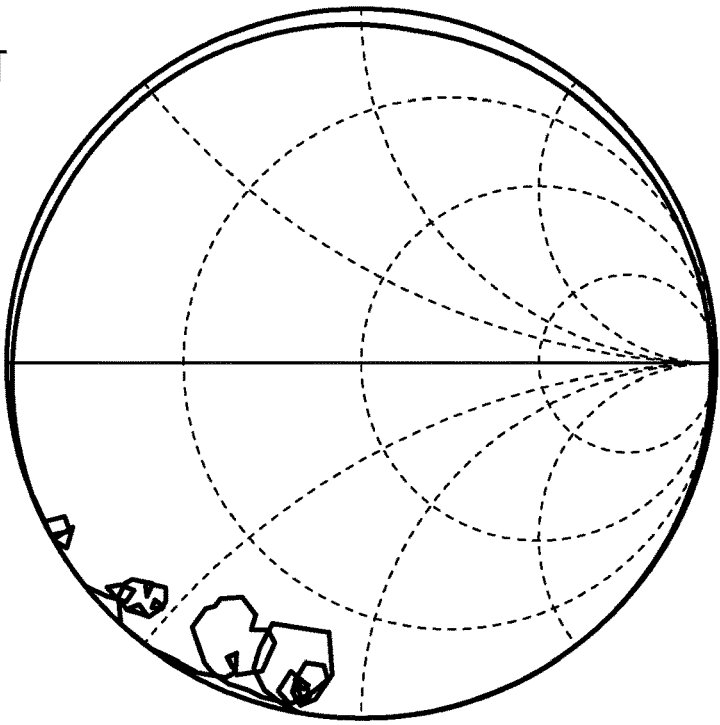
Figure 6A:
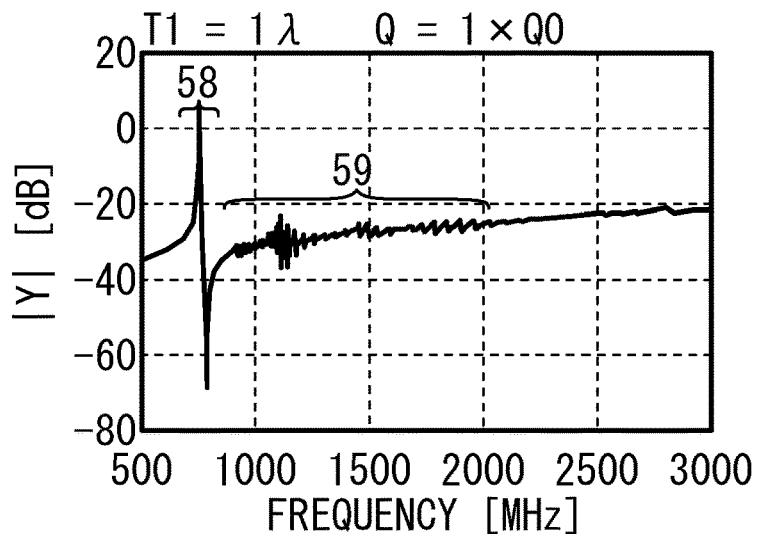
FIG. 6A to FIG. 6E illustrate the magnitude |Y| of admittance with respect to frequency in a simulation 2.
Figure 6B:
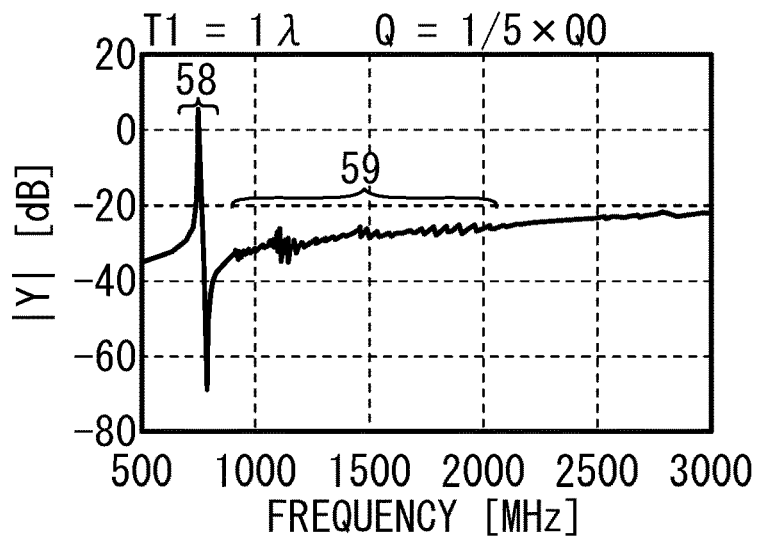
Figure 6C:
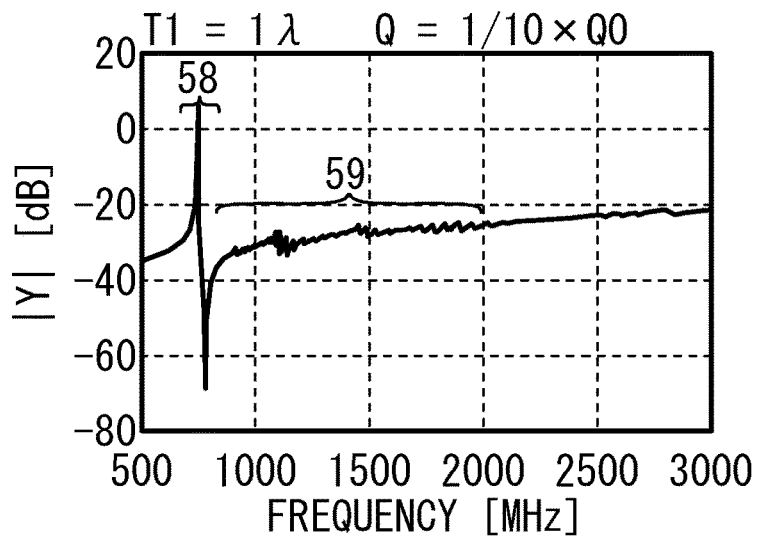
Figure 6D:
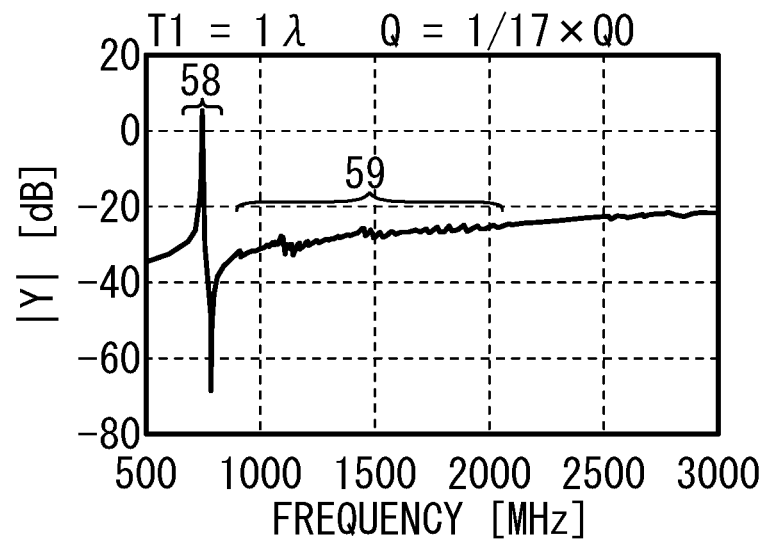
Figure 6E:
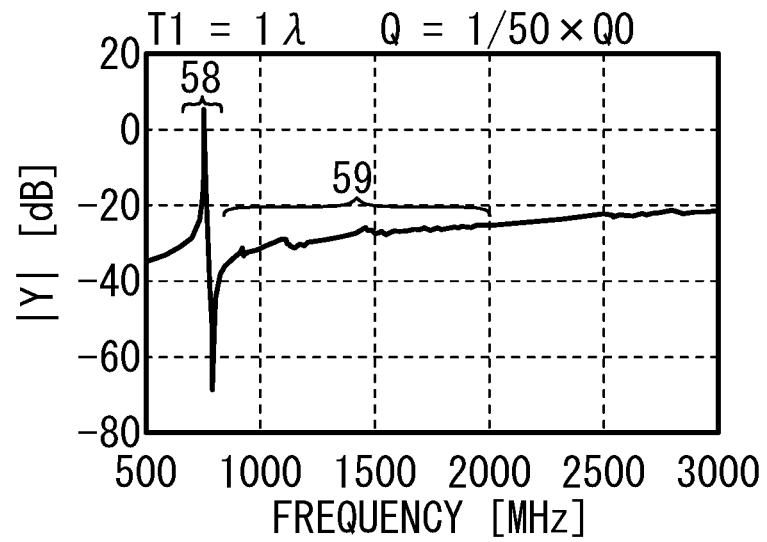
Figure 7A:
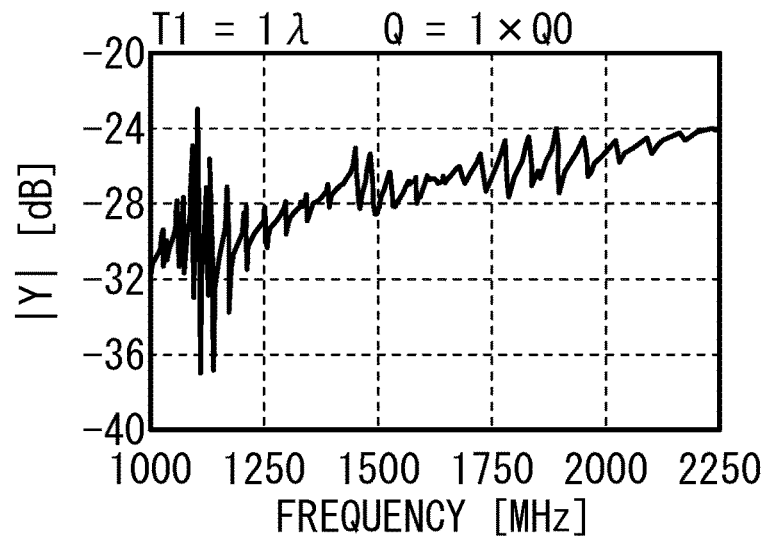
FIG. 7A to FIG. 7E are enlarged views around a spurious response 59 in FIG. 6A to FIG. 6E, respectively.
Figure 7B:
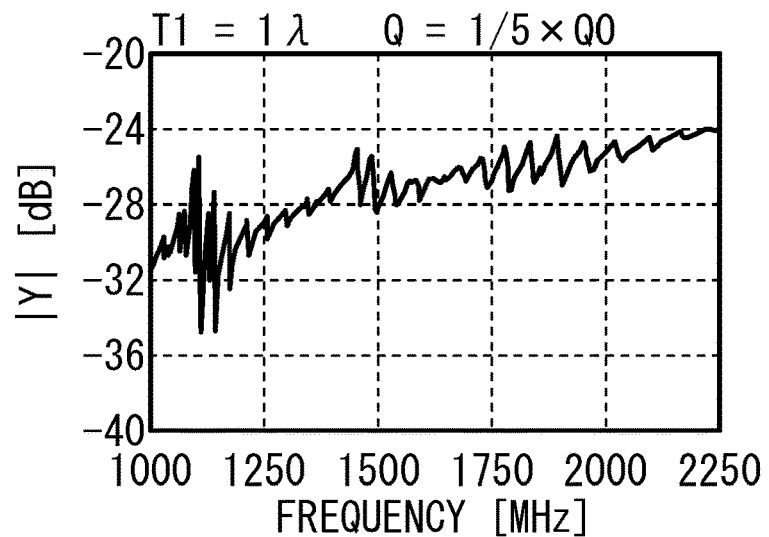
Figure 7C:
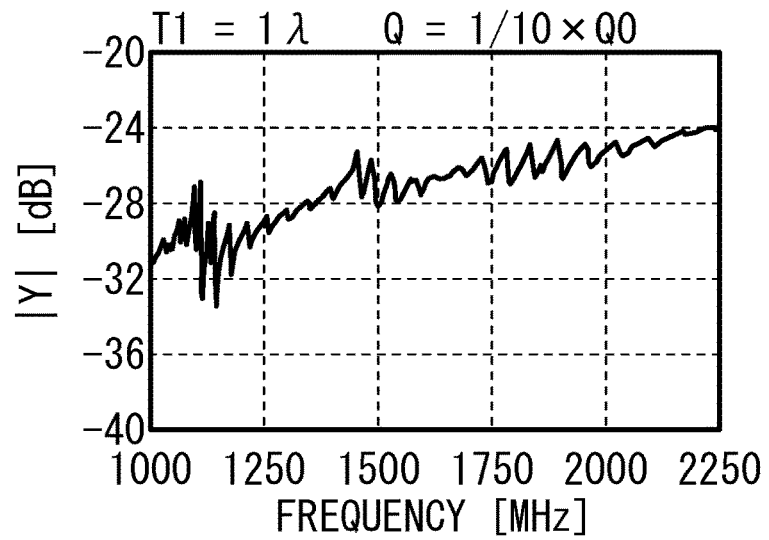
Figure 7D:
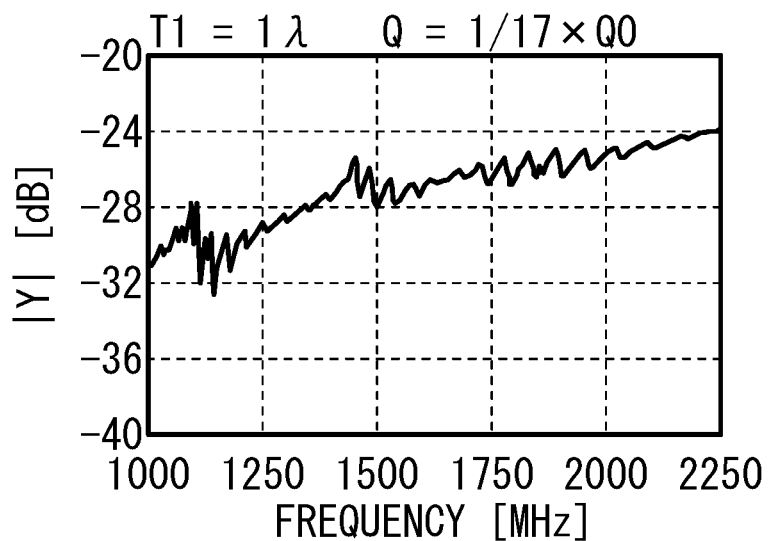
Figure 7E:
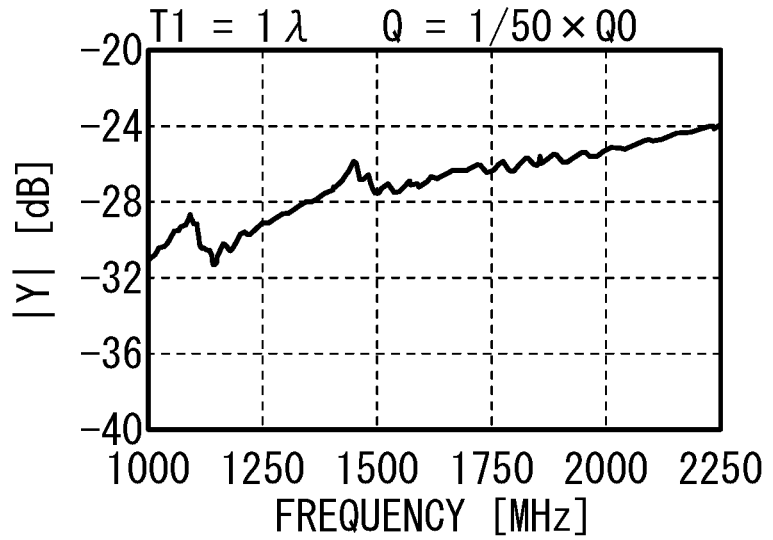

FIG. 5A and FIG. 5B are Smith charts of the impedance of the second comparative example and the first embodiment in the simulation 1, respectively. The Smith chart presents the impedance of the acoustic wave resonator within a frequency range from 500 MHz to 3000 MHz. As illustrated in FIG. 5A and FIG. 5B, in the first embodiment, the disparity of the impedance due to a high-frequency spurious emission is smaller than that in the second comparative example. As seen above, the first embodiment can reduce the spurious response 59 compared with the second comparative example without changing the magnitude of the main response 58.

Simulation 2

In a simulation 2, the Q factor of the intermediate layer 11 was varied from 1×Q0 to ⅟₅₀×Q0. The case where the Q factor of the intermediate layer 11 is 1×Q0 corresponds to the second comparative example. Q0 represents the Q factor of the boundary layer 12. Other conditions are the same as those of the first embodiment of the simulation 1.

FIG. 6A to FIG. 6E illustrate the magnitude |Y| of admittance with respect to frequency in the simulation 2. FIG. 7A to FIG. 7E are enlarged views around the spurious response 59 in FIG. 6A to FIG. 6E, respectively.

Figure 8A:
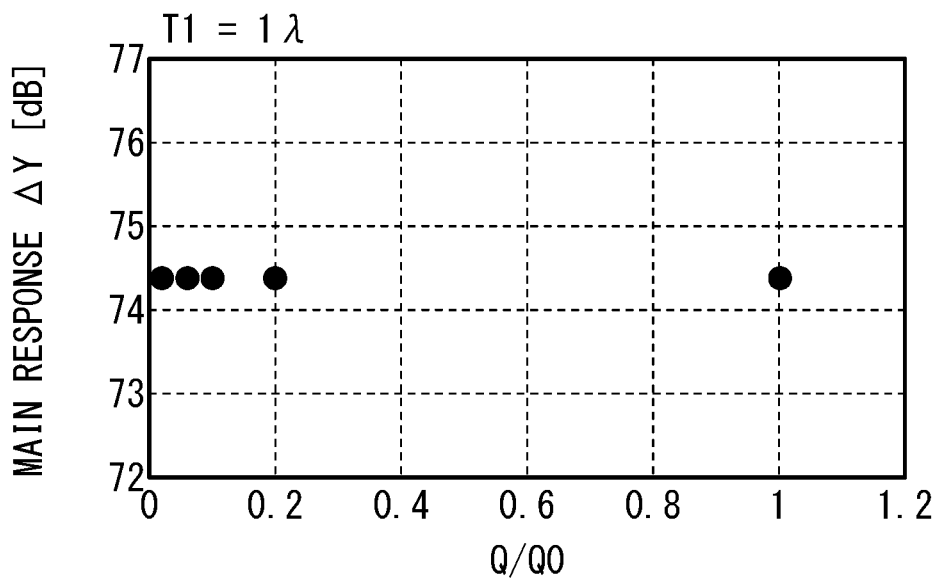
FIG. 8A and FIG. 8B illustrate the main response ΔY and the spurious response maxΔY with respect to the Q factor of an intermediate layer in the simulation 2.
Figure 8B:
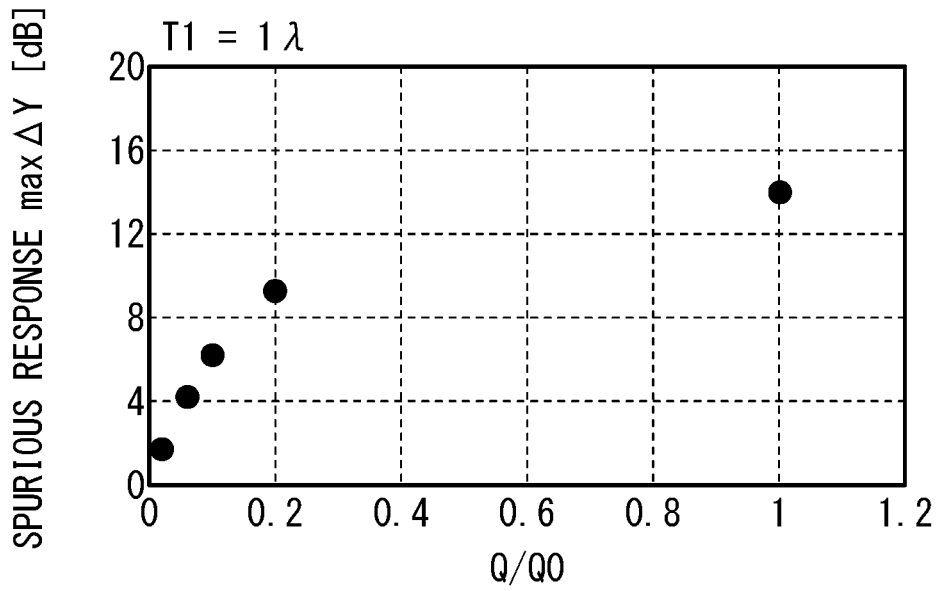
Figure 9A:
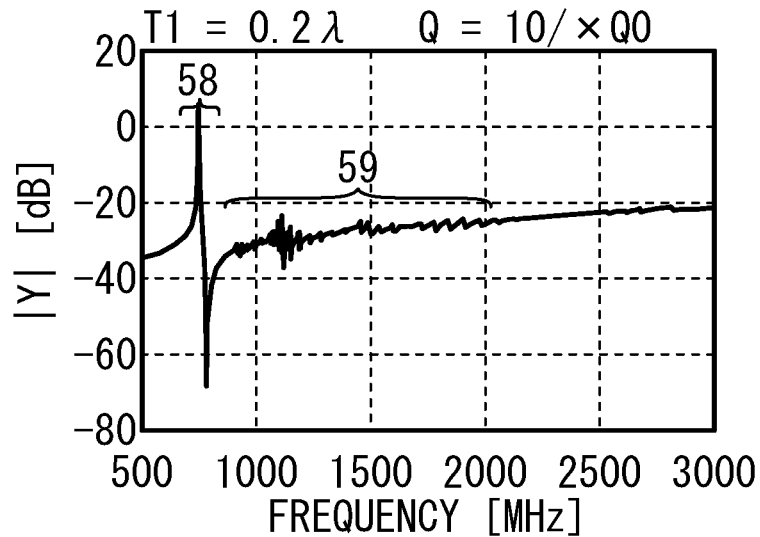
FIG. 9A to FIG. 9E illustrate the magnitude |Y| of admittance with respect to frequency in a simulation 3.
Figure 9B:
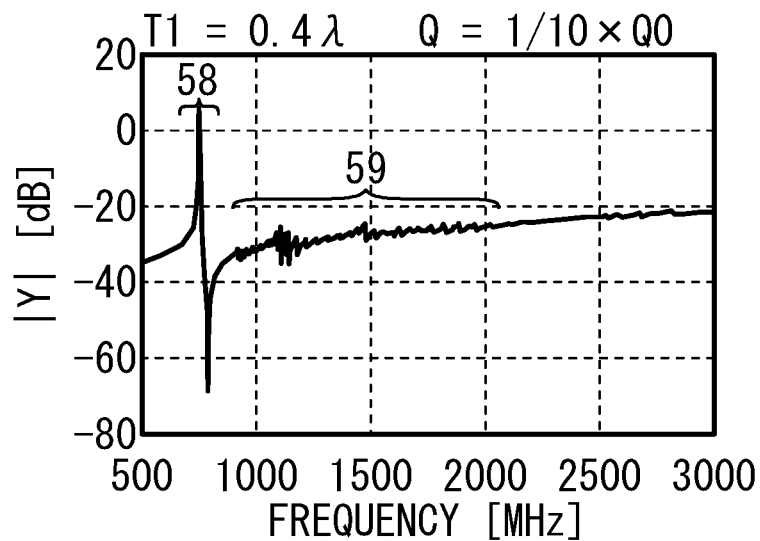
Figure 9C:
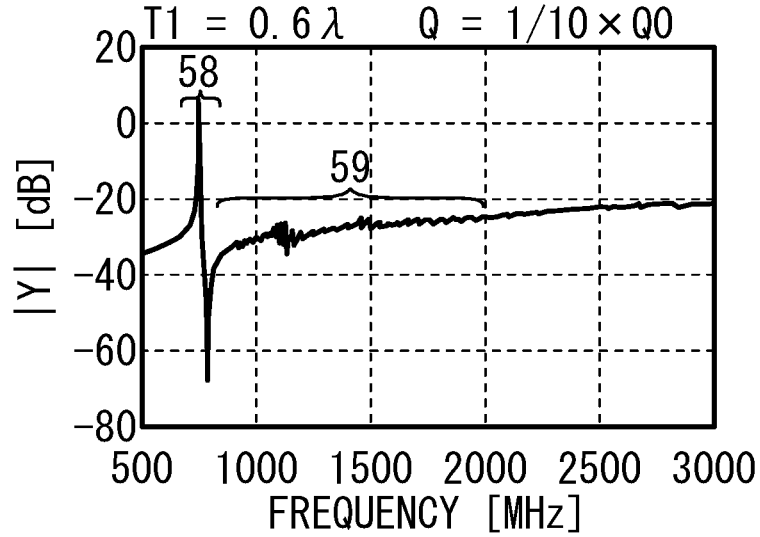
Figure 9D:
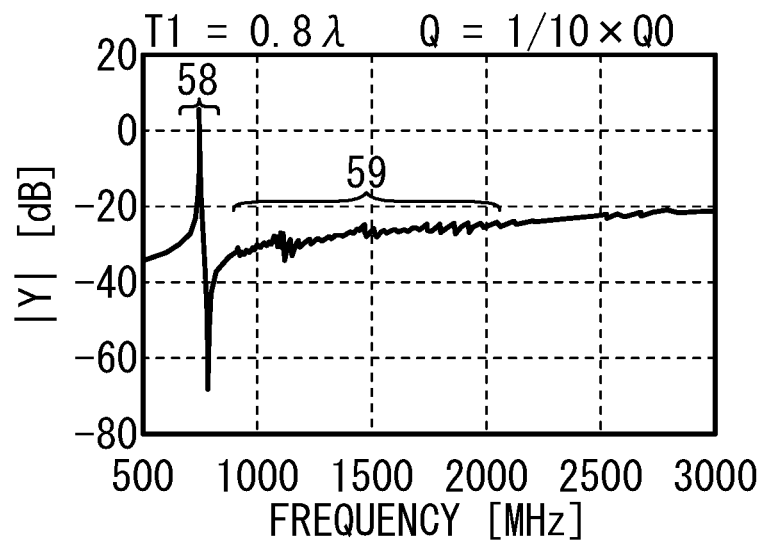
Figure 9E:
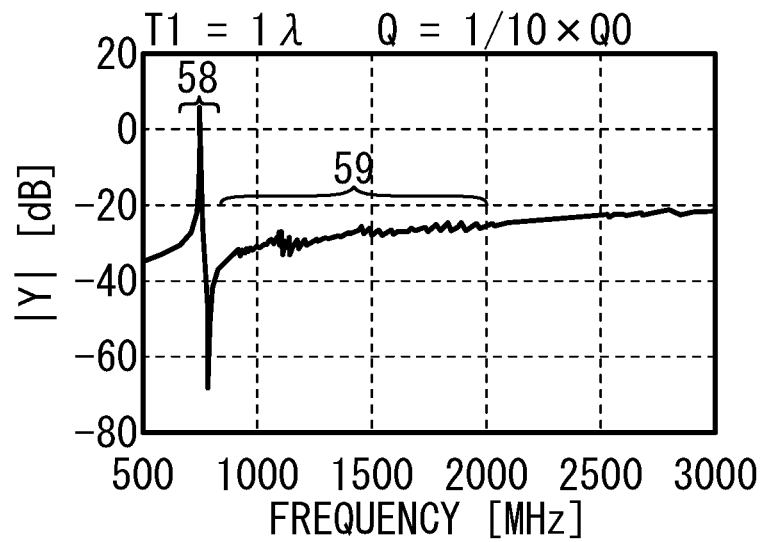
Figure 10A:
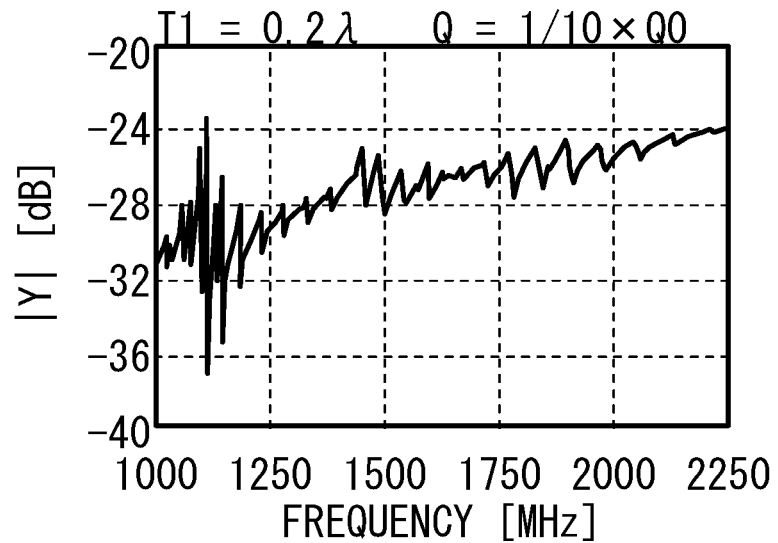
FIG. 10A to FIG. 10E are enlarged views around the spurious response 59 in FIG. 9A to FIG. 9E, respectively.
Figure 10B:
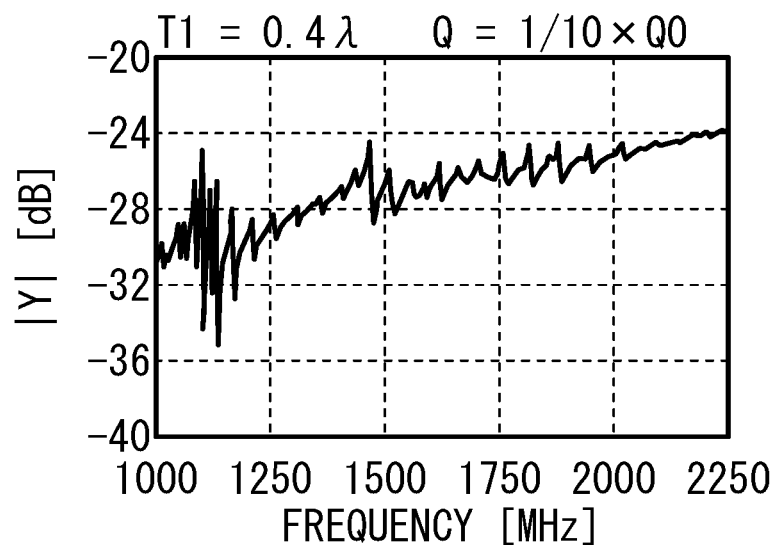
Figure 10C:
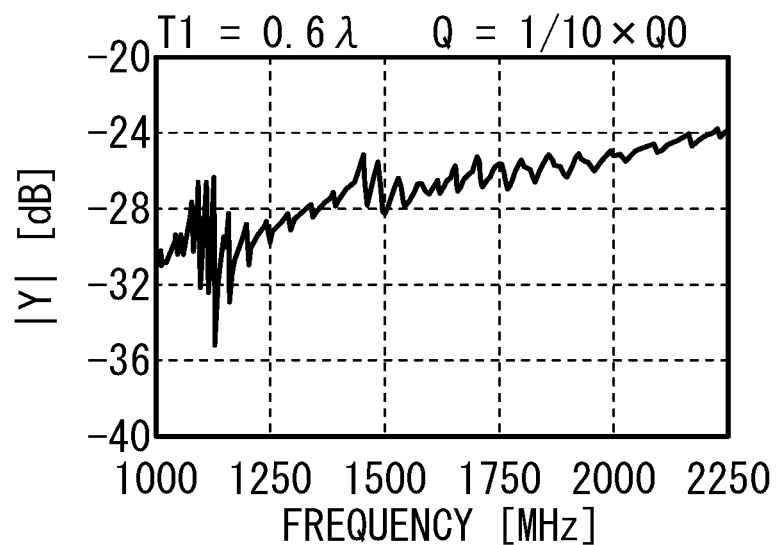
Figure 10D:
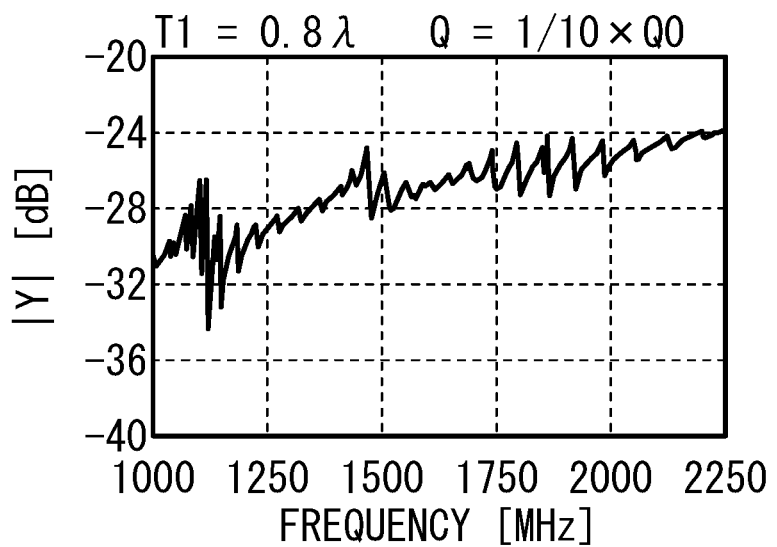
Figure 10E:
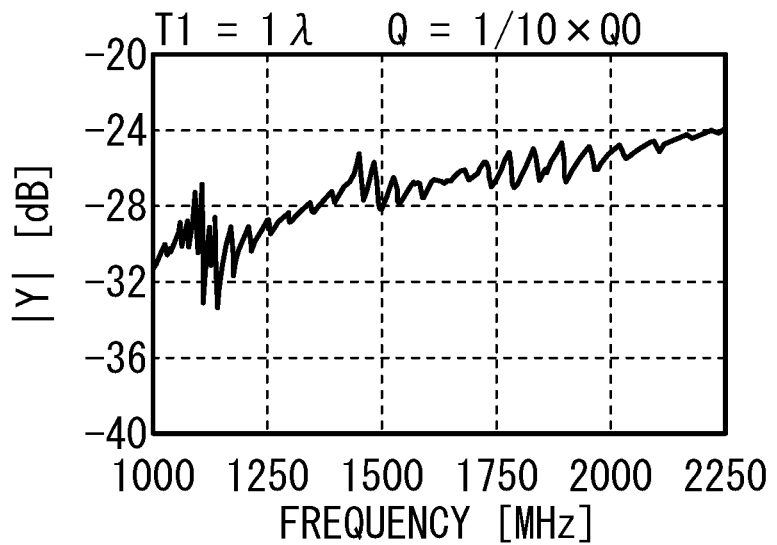

FIG. 8A and FIG. 8B illustrate the main response ΔY and the spurious response maxΔY with respect to the Q factor of the intermediate layer in the simulation 2, respectively. The main response ΔY is the difference between the admittance |Y| at the resonant frequency and the admittance |Y| at the antiresonant frequency around 750 MHz in FIG. 6A to FIG. 6E. The spurious response maxΔY is the largest ΔY among ΔY of the responses within a range from 1000 MHz to 2250 MHz in FIG. 7A to FIG. 7E.

As illustrated in FIG. 6A to FIG. 6E and FIG. 8A, the magnitude of the main response 58 little changes even when the Q factor of the intermediate layer 11 is varied. The main response ΔY when the Q factor of the intermediate layer 11 is 1×Q1 is approximately equal to the main response ΔY when the Q factor of the intermediate layer 11 is ⅟₅₀×Q2.

As illustrated in FIG. 7A to FIG. 7E and FIG. 8B, as the Q factor of the intermediate layer 11 decreases, the spurious response 59 decreases. When the Q factor of the intermediate layer 11 becomes equal to or less than 0.2×Q0, the spurious response maxΔY rapidly decreases. The spurious response maxΔY when the Q factor of the intermediate layer 11 is ⅟₅₀×Q0 is approximately ⅟₇ of the spurious response maxΔY when the Q factor is 1×Q0.

As seen above, the spurious response maxΔY can be reduced without changing the main response ΔY by adjusting the Q factor of the intermediate layer 11 to be less than the Q factor Q0 of the boundary layer 12.

Simulation 3

In a simulation 3, the Q factor of the intermediate layer 11 was configured to be ⅟₁₀×Q0, and the thickness T1 of the intermediate layer 11 was varied from 0.2λ to 1λ. Other conditions are the same as those of the first embodiment in the simulation 1.

Figure 11A:
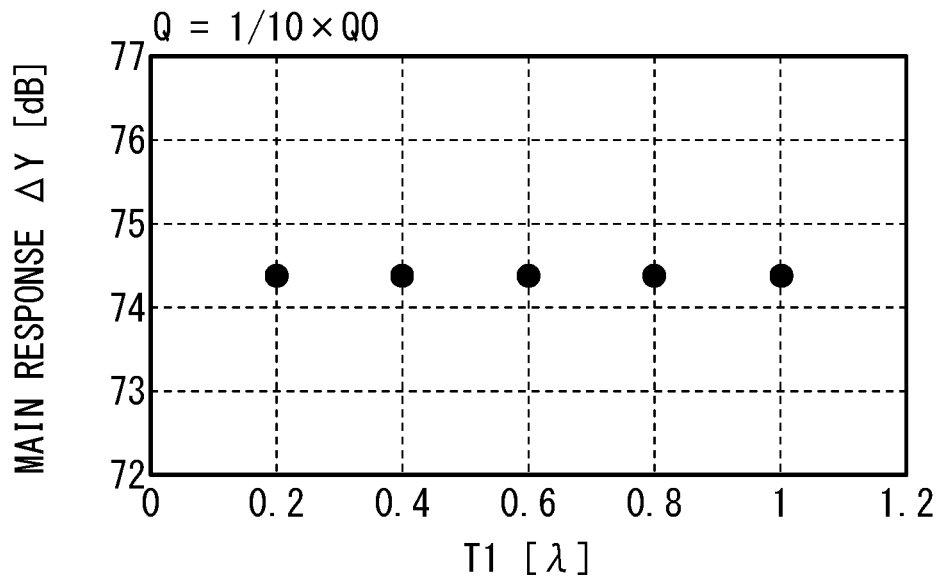
FIG. 11A and FIG. 11B illustrate the main response ΔY and the spurious response maxΔY with respect to the thickness T1 of the intermediate layer in the simulation 3, respectively.
Figure 11B:
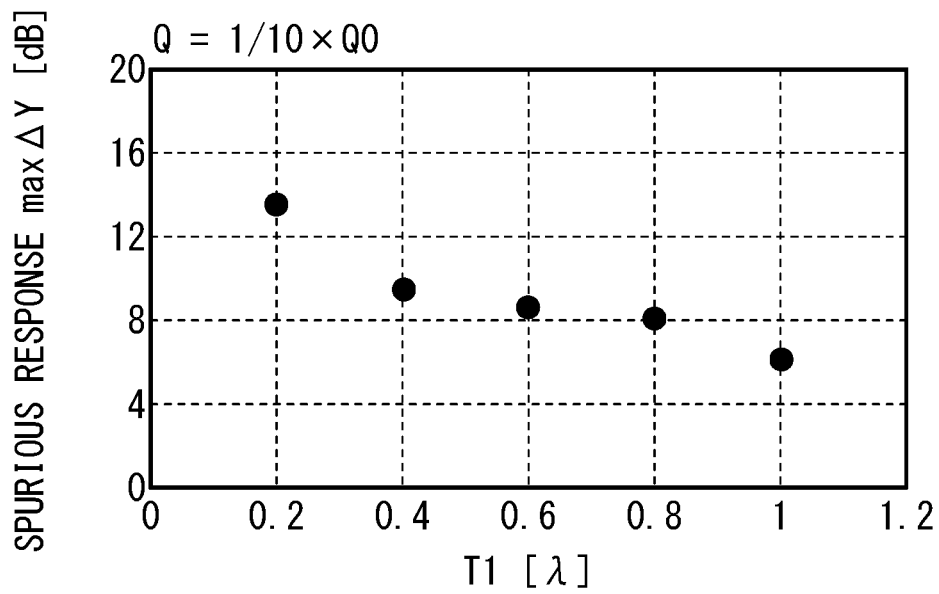

FIG. 9A to FIG. 9E illustrate the magnitude |Y| of admittance with respect to frequency in the simulation 3. FIG. 10A to FIG. 10E are enlarged views around the spurious response 59 in FIG. 9A to FIG. 9E, respectively. FIG. 11A and FIG. 11B illustrate the main response ΔY and the spurious response maxΔY with respect to the thickness T1 of the intermediate layer in the simulation 3, respectively.

As illustrated in FIG. 9A to FIG. 9E and FIG. 11A, the magnitude of the main response 58 little changes even when the thickness T1 of the intermediate layer 11 is varied. As illustrated in FIG. 10A to FIG. 10E and FIG. 11B, as the thickness T1 of the intermediate layer 11 increases, the spurious response 59 decreases. The spurious response maxΔY when the thickness T1 of the intermediate layer 11 is 1λ is approximately ½ of the spurious response maxΔY when the thickness T1 is 0.2λ. As seen above, the spurious response maxΔY can be reduced by increasing the thickness T1 of the intermediate layer 11.

Simulation 4

Figure 12:
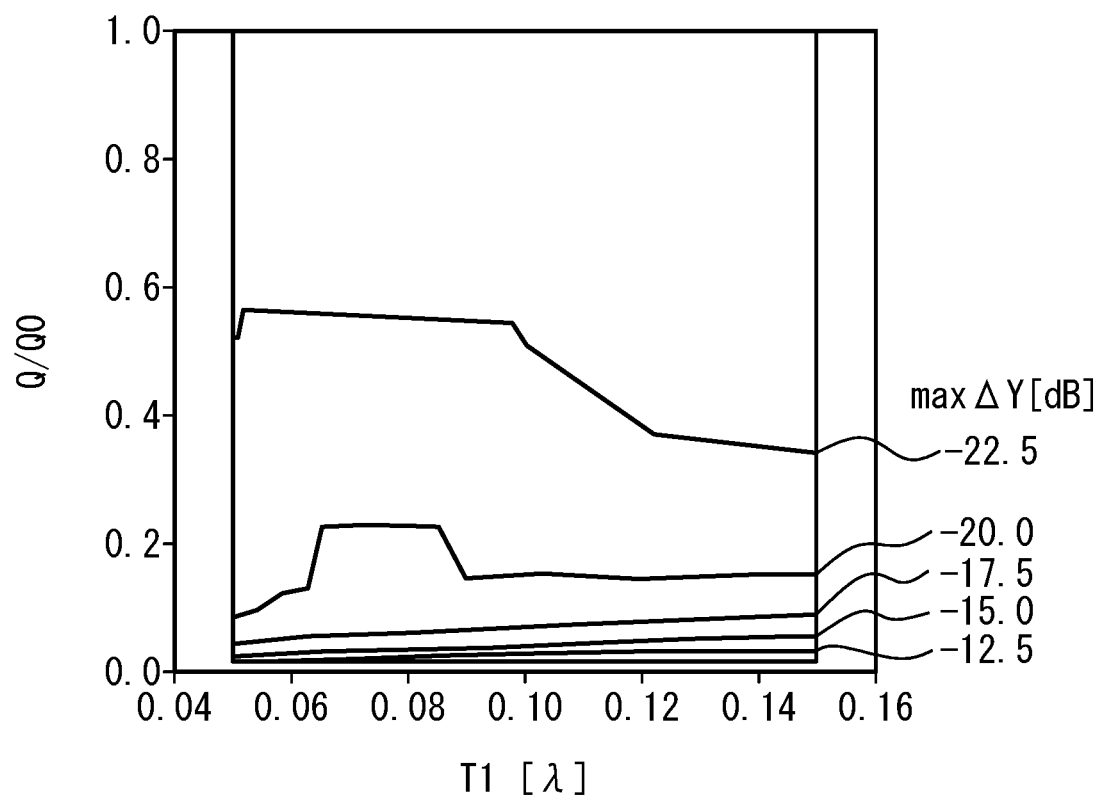
FIG. 12 illustrates the spurious response maxΔY with respect to the thickness and the Q factor of the intermediate layer in a simulation 4.

In a simulation 4, the spurious response maxΔY was simulated under the condition where the thickness T2 of the boundary layer 12 was configured to be 1.1λ and the Q factor and the thickness T1 of the intermediate layer 11 were varied. FIG. 12 illustrates the spurious response maxΔY with respect to the thickness and the Q factor of the intermediate layer in the simulation 4. As illustrated in FIG. 12, when the thickness T1 of the intermediate layer 11 is adjusted to be 0.05λ or greater and Q/Q0 of the intermediate layer 11 is adjusted to be 0.2 or less, the spurious response maxΔY is equal to or less than approximately −20 dB. When Q/Q0 of the intermediate layer 11 is adjusted to be 0.1 or less, the spurious response maxΔY is equal to or less than approximately −17.5 dB.

Simulation 5

In a simulation 5, the acoustic velocity of the bulk wave propagating through the intermediate layer 11 was configured to be different from the acoustic velocity of the bulk wave propagating through the boundary layer 12. The material and the acoustic velocity of the bulk wave of the intermediate layer 11 were configured as follows.

Sample A: Aluminum oxide, 4581.8 m/s
Sample B: Sapphire, 7068.2 m/s

The Q factor of the intermediate layer 11 was configured to be ⅟₅₀×Q0' where Q0' represents the Q factor of the support substrate 10. The thickness T1 of the intermediate layer 11 was configured to be 1λ, and other conditions were the same as those of the simulation 1.

Figure 13A:
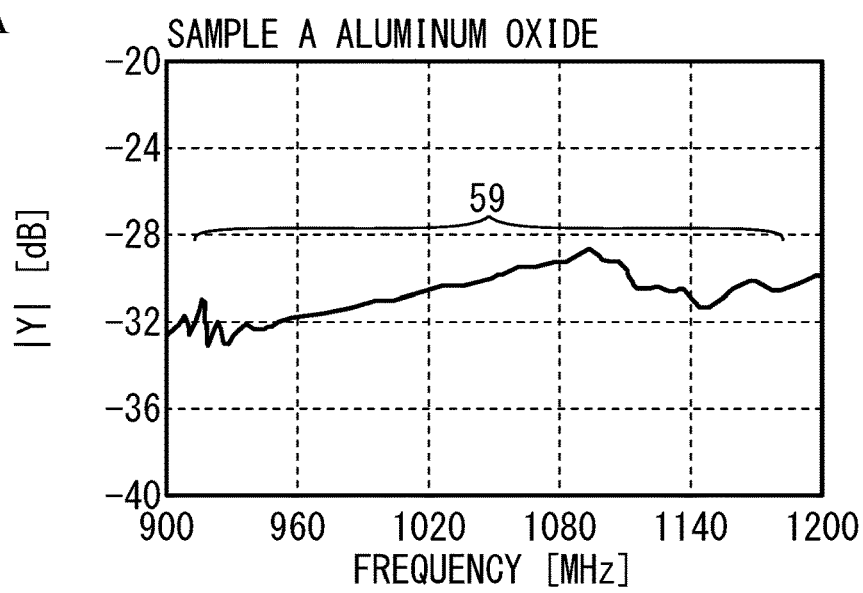
FIG. 13A to FIG. 13C illustrate the magnitude |Y| of the admittance of samples A and B and the second comparative example with respect to frequency in a simulation 5, respectively.
Figure 13B:
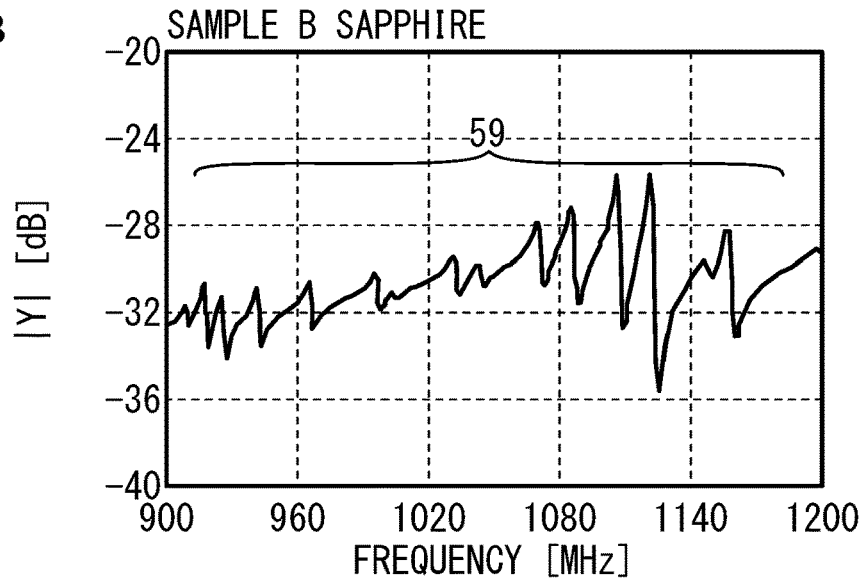
Figure 13C:
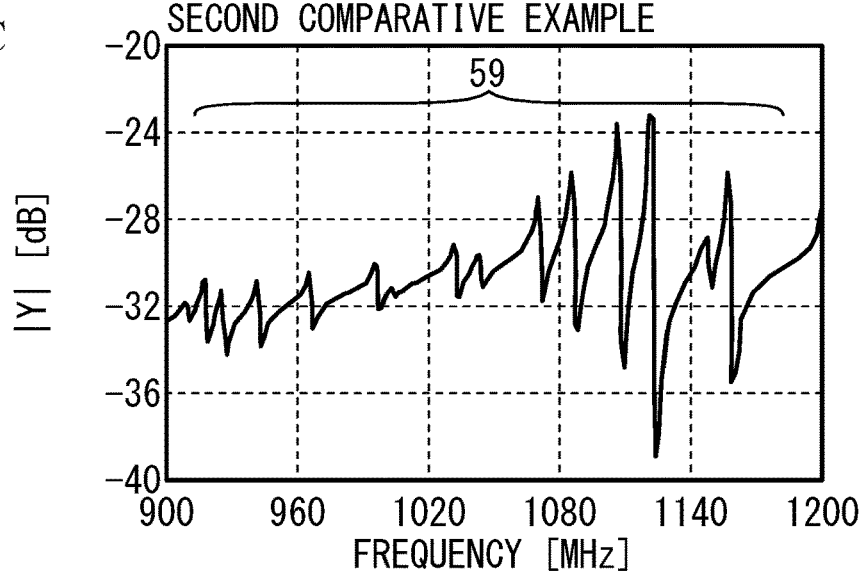
Figure 14A:
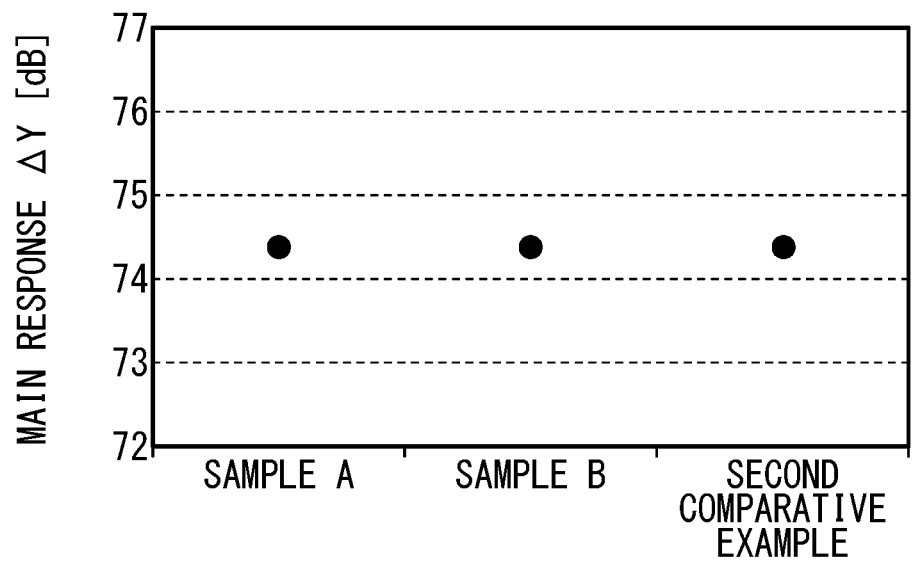
FIG. 14A and FIG. 14B illustrate the main response ΔY and the spurious response maxΔY in the simulation 5, respectively.
Figure 14B:
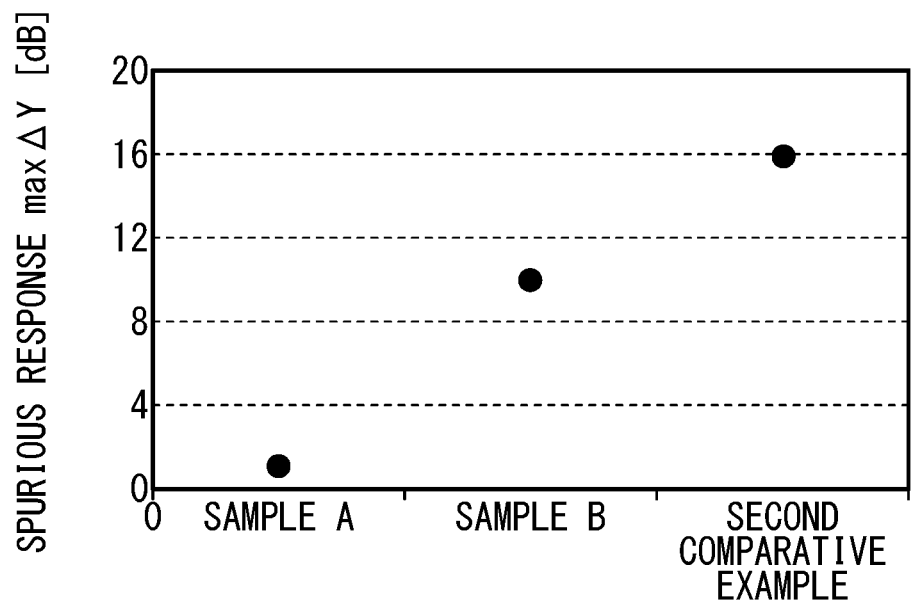

FIG. 13A to FIG. 13C illustrate the magnitude |Y| of the admittance of the samples A and B and the second comparative example with respect to frequency in the simulation 5, respectively. FIG. 14A and FIG. 14B illustrate the main response ΔY and the spurious response maxΔY in the simulation 5, respectively.

As illustrated in FIG. 14A, even when the acoustic velocity of the bulk wave propagating through the intermediate layer 11 is varied, the main response ΔY is approximately the same as that of the second comparative example. As illustrated in FIG. 13A to FIG. 13C and FIG. 14B, when the acoustic velocity of the bulk wave propagating through the intermediate layer 11 is made to be higher than that of the sample A as in the sample B, the spurious response max$\Delta$Y becomes larger, but is smaller than that of the second comparative example. As seen above, even when the acoustic velocity of the bulk wave propagating through the intermediate layer 11 is made to be different from the acoustic velocity of the bulk wave propagating through the boundary layer 12, high-frequency spurious emissions can be reduced without changing the magnitude of the main response. As clear from comparison between the samples A and B, the high-frequency spurious emissions are more reduced as the acoustic velocity of the bulk wave propagating through the intermediate layer 11 is decreased.

Simulation 6

In a simulation 6, the thickness T2 of the boundary layer 12 was varied. First, the thickness T2 of the boundary layer 12 was varied in the second comparative example where no intermediate layer 11 was provided. The conditions were the same as those of the second comparative example of the simulation 1 except in that the thickness T2 was varied and the thickness T3 of the temperature compensation film 13 was configured to be 0.1$\lambda$.

Figure 15A:
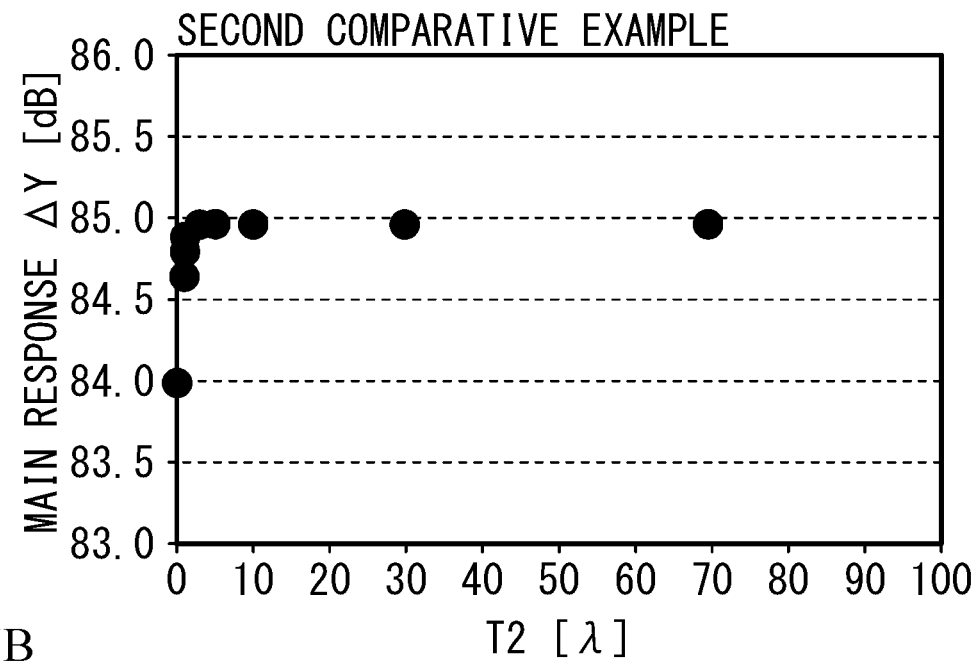
FIG. 15A to FIG. 15D illustrate the response with respect to the thickness T2 of the boundary layer in the second comparative example in a simulation 6.
Figure 15B:
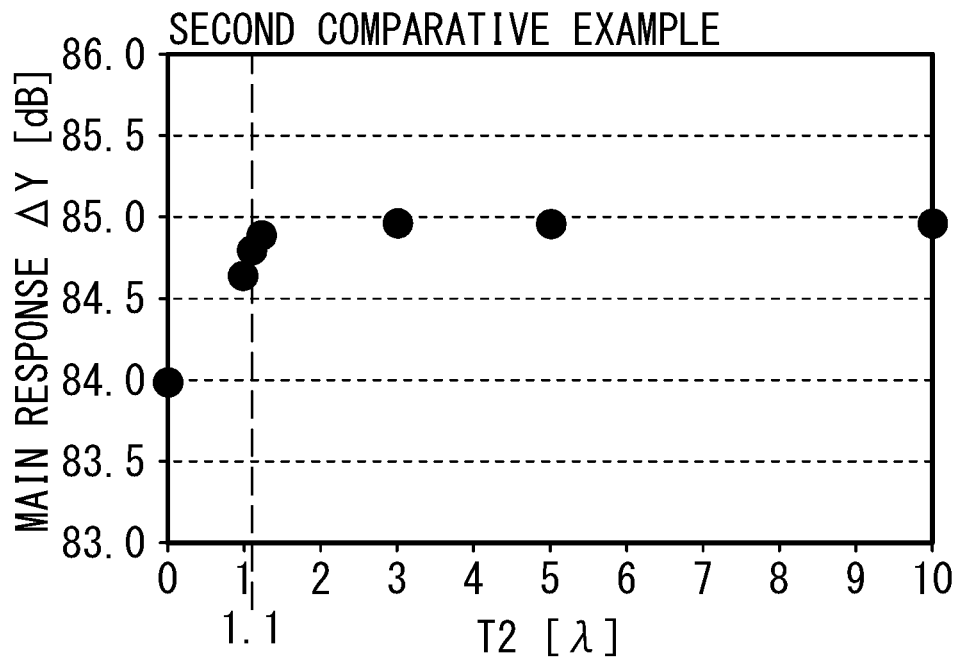
Figure 15C:
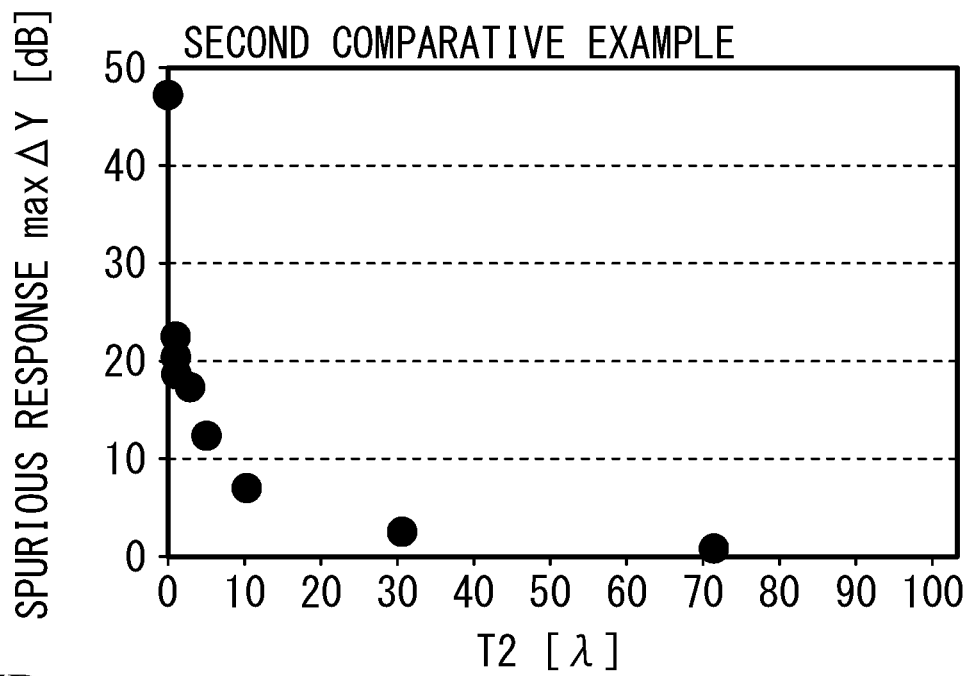
Figure 15D:
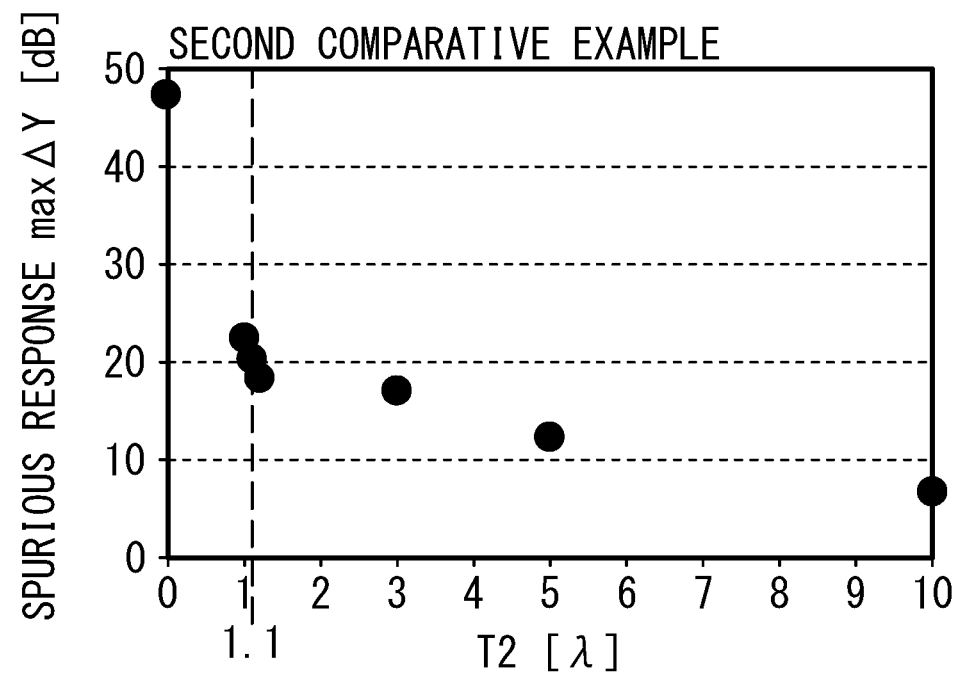

FIG. 15A to FIG. 15D illustrate the response with respect to the thickness T2 of the boundary layer 12 in the second comparative example of the simulation 6. FIG. 15A illustrates the main response, and FIG. 15B is an enlarged view of the part where the thickness T2 is 10$\lambda$ or less in FIG. 15A. FIG. 15C illustrates the spurious response, and FIG. 15D is an enlarged view of the part where the thickness T2 is 10$\lambda$ or less in FIG. 15C.

As illustrated in FIG. 15A and FIG. 15B, even when the thickness T2 of the boundary layer 12 is varied from 0$\lambda$ to 70$\lambda$, the main response $\Delta$Y does not vary. In particular, when the thickness T2 becomes 1.1$\lambda$ or less, the main response $\Delta$Y becomes slightly smaller, and when the thickness T2 becomes 1$\lambda$ or less, the main response $\Delta$Y becomes even smaller.

As illustrated in FIG. 15C and FIG. 15D, as the thickness T2 of the boundary layer 12 increases, the spurious response max$\Delta$Y decreases. As illustrated in FIG. 15C, when the thickness T2 becomes 10$\lambda$ or less, the spurious response max$\Delta$Y becomes larger. As illustrated in FIG. 15D, when the thickness T2 becomes 1.1 or less, the spurious response max$\Delta$Y rapidly increases, and becomes 20 dB or greater.

Next, the thickness T2 of the boundary layer 12 was varied in the first embodiment. The conditions were the same as those of the first embodiment of the simulation 1 except in that the thickness T2 was varied.

Figure 16A:
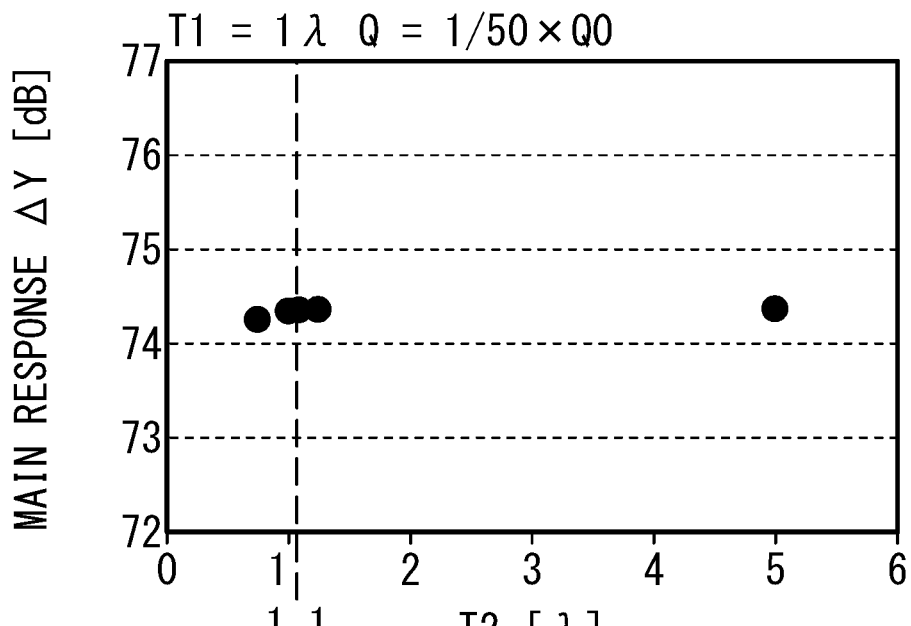
FIG. 16A and FIG. 16B illustrate the main response and the spurious response with respect to the thickness T2 of the boundary layer in the first embodiment of the simulation 6, respectively.
Figure 16B:
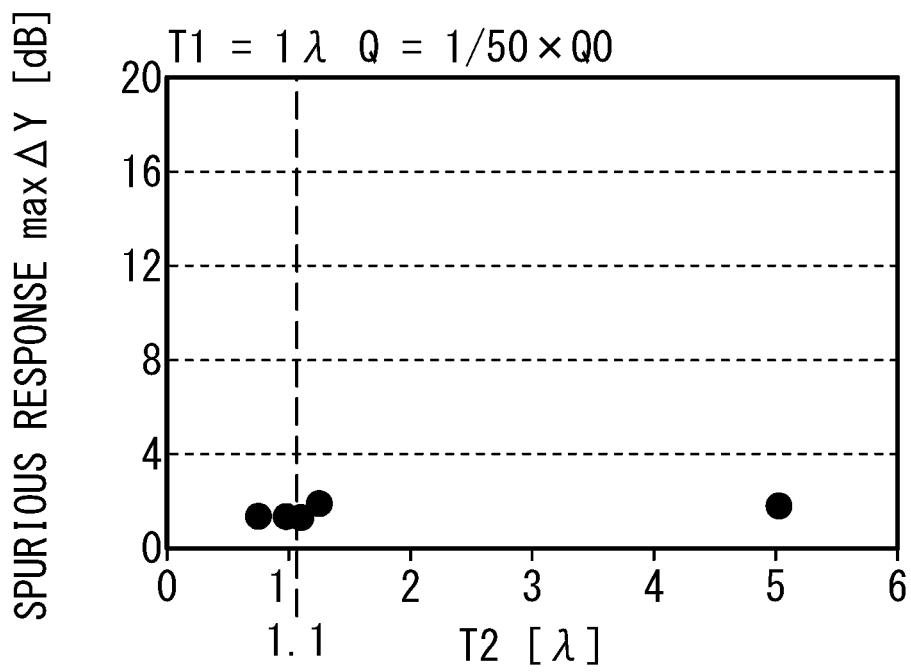

FIG. 16A and FIG. 16B illustrate the main response and the spurious response with respect to the thickness T2 of the boundary layer 12 in the first embodiment of the simulation 6, respectively. As illustrated in FIG. 16A, the main response $\Delta$Y depends little on the thickness T2 of the boundary layer 12. When the thickness T2 becomes 1.1$\lambda$ or less, the main response $\Delta$Y slightly decreases. As illustrated in FIG. 16B, the spurious response max$\Delta$Y depends little on the thickness T2 of the boundary layer 12. When the thickness T2 becomes 1.1$\lambda$ or less, the spurious response max$\Delta$Y slightly decreases.

In the simulation 6, the thickness T3 of the temperature compensation film 13 differs between the second comparative example and the first embodiment. Therefore, a simple comparison is not accurate, but in the first embodiment, the main response $\Delta$Y does not decrease even when the thickness T2 of the boundary layer 12 decreases, unlike the second comparative example, and the spurious response max$\Delta$Y does not increase. As seen above, the spurious response can be reduced even when the boundary layer 12 is thin. Thus, the increase in the number of manufacturing steps due to the increase in the thickness of the boundary layer 12 can be reduced.

In the second comparative example of FIG. 3A, the acoustic velocity of the bulk wave propagating through the boundary layer 12 is higher than the acoustic velocity of the bulk wave propagating through the temperature compensation film 13, and lower than the acoustic velocity of the bulk wave propagating through the support substrate 10. Therefore, as illustrated in FIG. 3A, the acoustic wave 52 including the bulk wave is reflected by the boundary face 35 between the boundary layer 12 and the support substrate 10. Therefore, as illustrated in FIG. 3B, the spurious response 59 is generated in the frequency range higher than the main response 58. Thus, in the first embodiment, the intermediate layer 11 having a Q factor lower than the Q factor of the boundary layer 12 is provided between the support substrate 10 and the boundary layer 12. This structure reduces the spurious response 59 without deteriorating the main response 58 as illustrated in FIG. 4A to FIG. 4C.

As illustrated in FIG. 12, the thickness T1 of the intermediate layer 11 is adjusted to be equal to or greater than 0.1 times the average pitch D of the electrode fingers 18 (equal to or greater than 0.05$\lambda$), and the Q factor of the intermediate layer 11 is adjusted to be equal to or less than 0.2 times the Q factor Q0 of the boundary layer 12. This configuration makes the spurious response max$\Delta$Y equal to or less than approximately −20 dB. To reduce the spurious response, the thickness T1 of the intermediate layer 11 is preferably equal to or greater than 0.2 times the average pitch D of the electrode fingers 18 (equal to or greater than 0.1$\lambda$), more preferably equal to or greater than 0.4 times the average pitch D of the electrode fingers 18 (equal to or greater than 0.2$\lambda$). The thickness T1 of the intermediate layer 11 is, for example, equal to or less than 10 times the average pitch D of the electrode fingers 18 (equal to or less than 5$\lambda$). To reduce the spurious response, the Q factor of the intermediate layer 11 is preferably equal to or less than 0.1 of, more preferably equal to or less than 0.05 of the Q factor Q0 of the boundary layer 12. The Q factor of the intermediate layer 11 is greater than 0. The average pitch D of the electrode fingers 18 can be calculated by dividing the length of the IDT 22 in the X direction by the number of the electrode fingers 18 in the acoustic wave resonator 26.

As illustrated in FIG. 16A, not to deteriorate the main response $\Delta$Y, the thickness T2 of the boundary layer 12 is preferably equal to or greater than 2.2 times the average pitch D of the electrode fingers 18 (equal to or greater than 1.1$\lambda$), more preferably equal to or greater than 3.0 times the average pitch D of the electrode fingers 18 (equal to or greater than 1.5$\lambda$). As illustrated in FIG. 15C and FIG. 15D, in the second comparative example, even when the thickness T2 of the boundary layer 12 is 1.1$\lambda$ or greater, as the thickness T1 increases, the spurious response max$\Delta$Y decreases. As the thickness of the boundary layer 12 increases, the number of manufacturing steps increases and the difficulty level of the manufacturing process increases. On the other hand, as illustrated in FIG. 16B, in the first embodiment, the spurious response max$\Delta$Y little changes when the thickness T2 of the boundary layer 12 is 1.1$\lambda$ or greater. That is, in the first embodiment, even when the thickness T2 of the boundary layer 12 is not as thick as that of the second comparative example, the spurious response can be reduced. Since the boundary layer 12 can be made to be thin, the number of manufacturing steps and the difficulty level of the manufacturing process can be reduced. Therefore, the thickness T2 of the boundary layer 12 is preferably equal to or less than 10 times the average pitch D of the electrode fingers 18 (equal to or less than 5λ), more preferably equal to or less than 8 times the average pitch D of the electrode fingers 18 (equal to or less than 4λ).

As illustrated in FIG. 3B, to cause the acoustic wave 52 including the bulk wave to pass through the boundary layer 12, the thickness T3 of the temperature compensation film 13 is preferably equal to or less than 1.5 times the average pitch D of the electrode fingers 18 (equal to or less than 0.75λ), more preferably equal to or less than 1 time the average pitch D of the electrode fingers 18 (equal to or less than 0.5λ). To cause the temperature compensation film 13 to fulfill the temperature compensation function, the thickness T3 is preferably equal to or greater than 0.05 times the average pitch D of the electrode fingers 18 (equal to or greater 0.1λ), more preferably equal to or greater than 0.1 times the average pitch D of the electrode fingers 18 (equal to or greater 0.2λ).

To cause the energy of the acoustic wave of the main response to exist within the temperature compensation film 13, the thickness T4 of the piezoelectric layer 14 is preferably equal to or less than 2 times the average pitch D of the electrode fingers 18 (equal to or less than 1λ), more preferably equal to or less than 1 time the average pitch D of the electrode fingers 18 (equal to or less than 0.5λ). To cause the piezoelectric layer 14 to fulfill the function, the thickness T4 of the piezoelectric layer 14 is preferably equal to or greater than 0.05 times the average pitch D of the electrode fingers 18 (equal to or greater than 0.1λ), more preferably equal to or greater than 0.1 times the average pitch D of the electrode fingers 18 (equal to or greater than 0.2λ).

When most of the energy of the surface acoustic wave exists in the section from the surface of the piezoelectric layer 14 to a depth of 2λ, to confine the acoustic wave of the main response in the piezoelectric layer 14 and the temperature compensation film 13 and reduce the spurious response, the distance (T3+T4) between a first surface, which is closer to the support substrate 10, of the temperature compensation film 13 and a second surface, which is closer to the comb-shaped electrode 20, of the piezoelectric layer 14 is preferably equal to or less than 4 times the average pitch D of the electrode fingers 18 (equal to or less than 2λ), more preferably equal to or less than 3 times the average pitch D of the electrode fingers 18 (equal to or less than 1.5λ), further preferably equal to or less than 2 times the average pitch D of the electrode fingers 18 (equal to or less than 1λ).

Since the acoustic wave 52 including the bulk wave is reflected by the intermediate layer 11, the boundary layer 12 and the intermediate layer 11 are preferably in contact with each other, and the temperature compensation film 13 and the boundary layer 12 are preferably in contact with each other.

The acoustic velocity of the bulk wave propagating through the temperature compensation film 13 may be higher than the acoustic velocity of the bulk wave propagating through the piezoelectric layer 14. However, to allow the acoustic wave to be more likely to exist in the temperature compensation film 13, the acoustic velocity of the bulk wave propagating through the temperature compensation film 13 is preferably lower than the acoustic velocity of the bulk wave propagating through the piezoelectric layer 14. This configuration allows the temperature compensation film 13 to function as a temperature compensation film more. The acoustic velocity of the bulk wave propagating through the temperature compensation film 13 is preferably equal to or less than 0.99 times the acoustic velocity of the bulk wave propagating through the piezoelectric layer 14. When the acoustic velocity of the bulk wave propagating through the temperature compensation film 13 is too low, the acoustic wave is less likely to exist in the piezoelectric layer 14. Thus, the acoustic velocity of the bulk wave propagating through the temperature compensation film 13 is preferably equal to or greater than 0.9 times the acoustic velocity of the bulk wave propagating through the piezoelectric layer 14.

The acoustic velocity of the bulk wave propagating through the boundary layer 12 is preferably equal to or greater than 1.1 times, more preferably equal to or greater than 1.2 times the acoustic velocity of the bulk wave propagating through the temperature compensation film 13. In addition, the acoustic velocity of the bulk wave propagating through the boundary layer 12 is preferably higher than the acoustic velocity of the bulk wave propagating through the piezoelectric layer 14. When the acoustic velocity of the bulk wave propagating through the boundary layer 12 is too high, the acoustic wave 52 including a bulk wave is reflected by the boundary face 32 between the boundary layer 12 and the temperature compensation film 13. Therefore, the acoustic velocity of the bulk wave propagating through the boundary layer 12 is preferably equal to or less than 2.0 times, more preferably equal to or less than 1.5 times the acoustic velocity of the bulk wave propagating through the temperature compensation film 13.

The acoustic velocity of the bulk wave propagating through the support substrate 10 is preferably equal to or greater than 1.1 times, more preferably equal to or greater than 1.2 times the acoustic velocity of the bulk wave propagating through the boundary layer 12. The acoustic velocity of the bulk wave propagating through the support substrate 10 is equal to or less than 2.0 times the acoustic velocity of the bulk wave propagating through the boundary layer 12.

The acoustic velocity of the bulk wave propagating through the boundary layer 12 and the acoustic velocity of the bulk wave propagating through the intermediate layer 11 can be made to be substantially equal to each other by adjusting the main component of the boundary layer 12 to be the same as the main component of the intermediate layer 11. As in the simulations 1 to 6 of the first embodiment, the piezoelectric layer 14 is made to be mainly composed of lithium tantalate or lithium niobate, and be monocrystalline. The temperature compensation film 13 is made to be mainly composed of silicon oxide, and be polycrystalline or amorphous. The boundary layer 12 and the intermediate layer 11 are made to be mainly composed of aluminum oxide, and be polycrystalline or amorphous. This configuration reduces the spurious response. When a certain layer is mainly composed of a certain material, this means that it is acceptable for the certain layer to contain impurities intentionally or unintentionally, and means that the certain layer contains 50 atomic % or greater of the certain material, or 80 atomic % or greater of the certain material. For example, when the boundary layer 12 is mainly composed of aluminum oxide, this means that the boundary layer 12 contains, for example, 50 atomic % or greater of the total composition of aluminum and oxygen, or contains 80 atomic % or greater of the total composition of aluminum and oxygen.

First Variation of the First Embodiment

Figure 17:
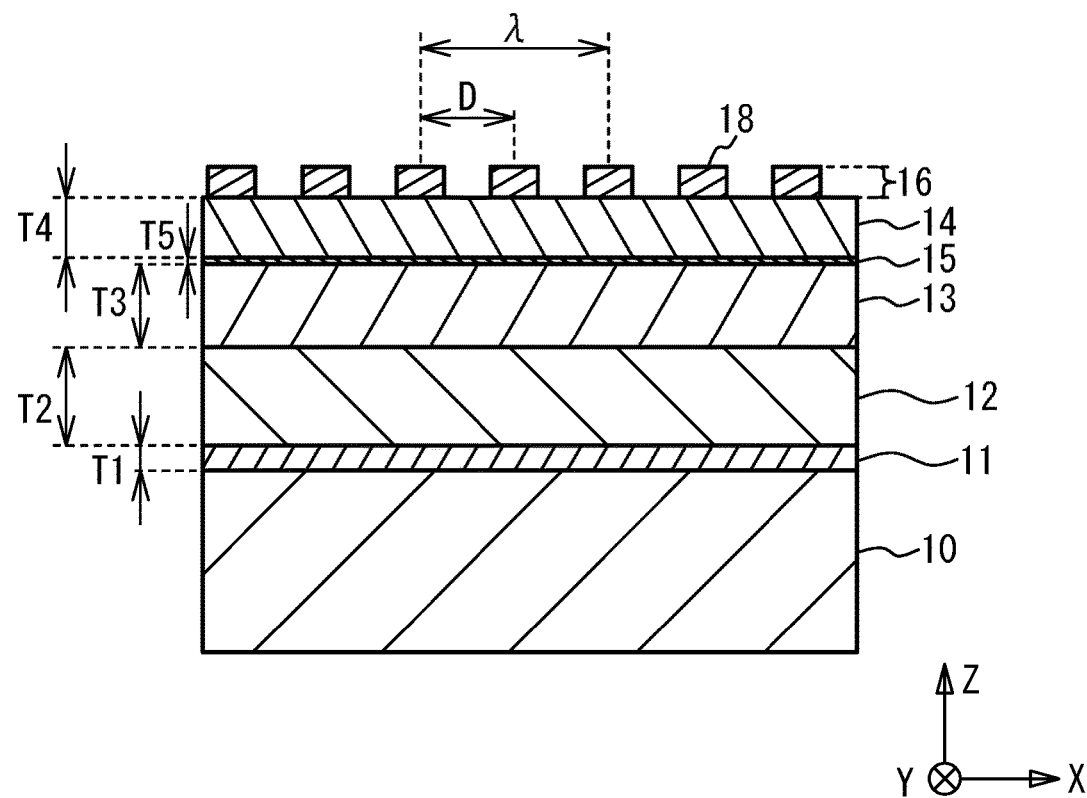
FIG. 17 is a cross-sectional view of an acoustic wave resonator in accordance with a first variation of the first embodiment.

FIG. 17 is a cross-sectional view of an acoustic wave resonator in accordance with a first variation of the first embodiment. As illustrated in FIG. 17, a bonding layer 15 is interposed between the piezoelectric layer 14 and the temperature compensation film 13. The bonding layer 15 bonds the piezoelectric layer 14 to the temperature compensation film 13. When it is difficult to directly bond the piezoelectric layer 14 to the temperature compensation film 13, the bonding layer 15 may be provided. The bonding layer 15 is formed of, for example, an aluminum oxide film, a silicon film, an aluminum nitride film, a silicon nitride film, or a silicon carbide film. The thickness T5 of the bonding layer 15 is preferably 20 nm or less, more preferably 10 nm or less so as not to impair the functions of the piezoelectric layer 14 and the temperature compensation film 13. To maintain the function as the bonding layer 15, the thickness T5 is preferably 1 nm or greater, more preferably 2 nm or greater. To confine the acoustic wave of the main response in the piezoelectric layer 14, the acoustic velocity of the bulk wave propagating through the bonding layer 15 is preferably higher than the acoustic velocity of the bulk wave propagating through the temperature compensation film 13. Other structures are the same as those of the first embodiment, and the description thereof is thus omitted.

In the first embodiment and the variation thereof, when the acoustic wave mainly excited by a pair of the comb-shaped electrodes 20 is a shear horizontal (SH) wave, a bulk wave is easily excited as an unnecessary wave. When the piezoelectric layer 14 is a 36° or greater and 48° or less rotated Y-cut X-propagation lithium tantalate layer, an SH wave is excited. Thus, the boundary layer 12 is preferably provided in this case. The acoustic wave mainly excited by a pair of the comb-shaped electrodes 20 is not limited to an SH wave, and may be, for example, a Lamb wave.

Second Embodiment

Figure 18A:
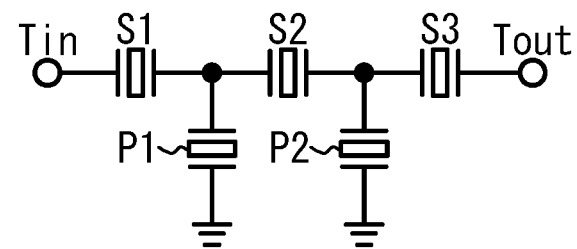
FIG. 18A is a circuit diagram of a filter in accordance with a second embodiment.

FIG. 18A is a circuit diagram of a filter in accordance with a second embodiment. As illustrated in FIG. 18A, one or more series resonators S1 to S3 are connected in series between an input terminal Tin and an output terminal Tout. One or more parallel resonators P1 and P2 are connected in parallel between the input terminal Tin and the output terminal Tout. At least one of the following resonators: one or more series resonators S1 to S3 and one or more parallel resonators P1 and P2 may be the acoustic wave resonator according to any one of the first embodiment and the variation thereof. The number of the resonators of the ladder-type filter can be freely selected. The filter may be a multimode type filter.

First Variation of the Second Embodiment

Figure 18B:
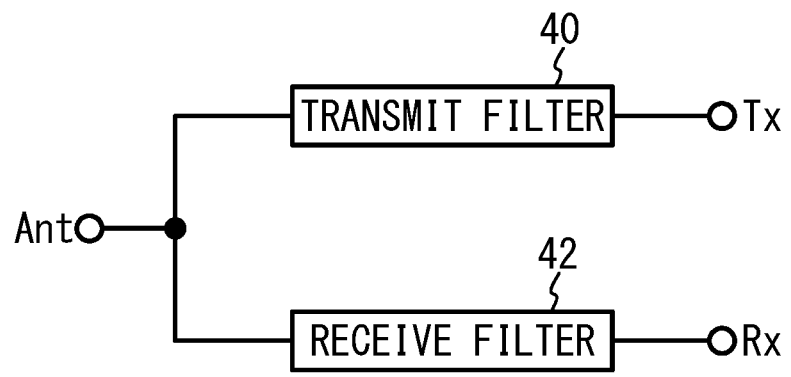
FIG. 18B is a circuit diagram of a duplexer in accordance with a first variation of the second embodiment.

FIG. 18B is a circuit diagram of a duplexer in accordance with a first variation of the second embodiment. As illustrated in FIG. 18B, a transmit filter 40 is connected between a common terminal Ant and a transmit terminal Tx. A receive filter 42 is connected between the common terminal Ant and a receive terminal Rx. The transmit filter 40 transmits signals in the transmit band to the common terminal Ant as transmission signals among high-frequency signals input from the transmit terminal Tx, and suppresses signals with other frequencies. The receive filter 42 transmits signals in the receive band to the receive terminal Rx as reception signals among high-frequency signals input from the common terminal Ant, and suppresses signals with other frequencies. At least one of the transmit filter 40 and the receive filter 42 can be the filter of the second embodiment.

A duplexer has been described as an example of the multiplexer, but the multiplexer may be a triplexer or a quadplexer.

Third Embodiment

Figure 19A:
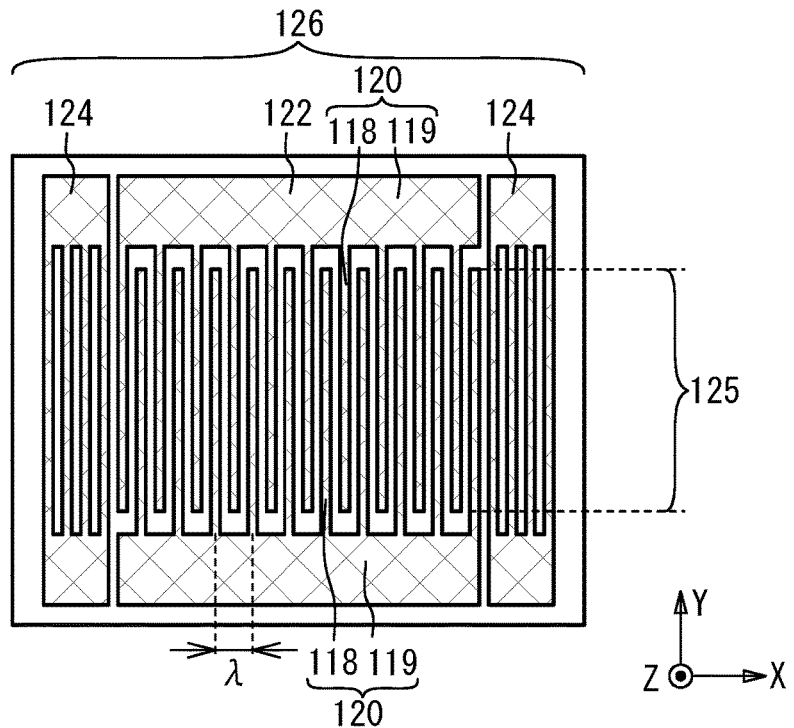
FIG. 19A is a plan view of an acoustic wave resonator in a third embodiment.
Figure 19B:
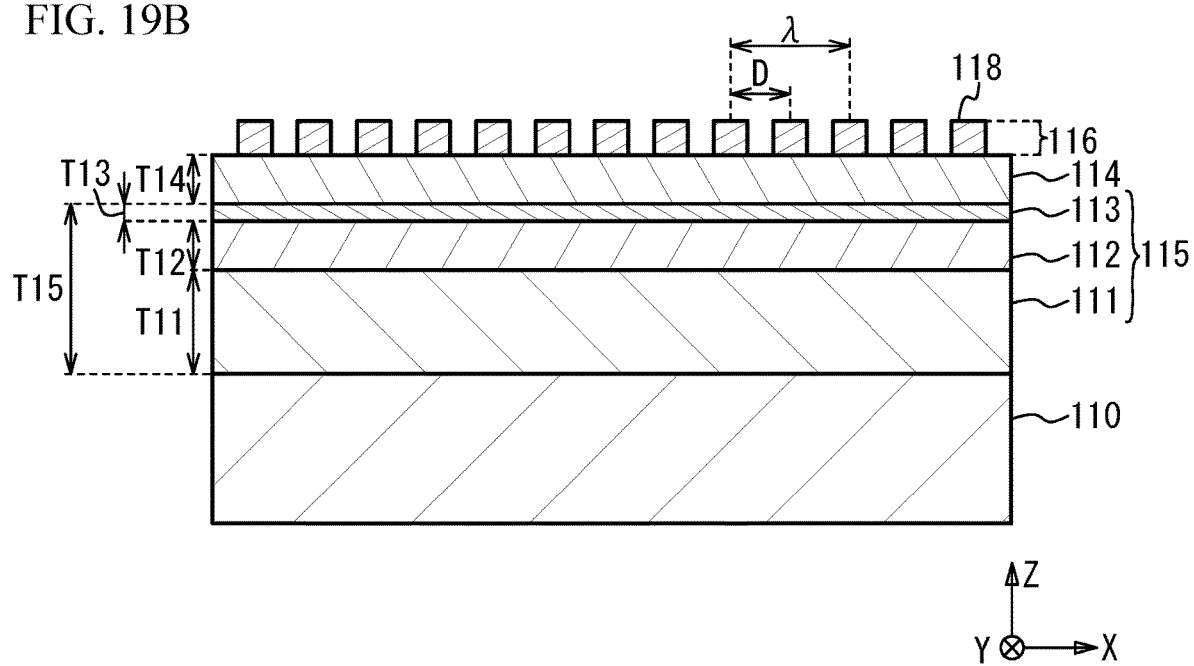
FIG. 19B is a cross-sectional view of the acoustic wave resonator in the third embodiment.

In a third embodiment, an example where the acoustic wave device has an acoustic wave resonator will be described. FIG. 19A is a plan view of an acoustic wave resonator in accordance with the third embodiment, and FIG. 19B is a cross-sectional view of the acoustic wave resonator in accordance with the third embodiment. The direction in which electrode fingers are arranged (the arrangement direction of the electrode fingers) is defined as the X direction, the direction in which the electrode finger extends (the extension direction of the electrode finger) is defined as the Y direction, and the direction in which a support substrate and a piezoelectric layer are stacked (the stack direction of the support substrate and the piezoelectric layer) is defined as the Z direction. The X direction, the Y direction, and the Z direction do not necessarily correspond to the X-axis orientation and the Y-axis orientation of the crystal orientation of the piezoelectric layer. When the piezoelectric layer is a rotated Y-cut X-propagation substrate, the X direction corresponds to the X-axis orientation of the crystal orientation.

As illustrated in FIG. 19A and FIG. 19B, a piezoelectric layer 114 is provided over a support substrate 110. An intermediate layer 112 is interposed between the support substrate 110 and the piezoelectric layer 114. Another intermediate layer 111 is interposed between the intermediate layer 112 and the support substrate 110. A bonding layer 113 is interposed between the intermediate layer 112 and the piezoelectric layer 114. The intermediate layers 111 and 112 and the bonding layer 113 form a multilayered film 115. The bottom surface of the multilayered film 115 is in contact with the support substrate 110, and the top surface of the multilayered film 115 is in contact with the piezoelectric layer 114. The thicknesses of the intermediate layers 111 and 112, the bonding layer 113, the piezoelectric layer 114, and the multilayered film 115 are represented by T11, T12, T13, T14, and T15, respectively.

An acoustic wave resonator 126 is disposed on the piezoelectric layer 114. The acoustic wave resonator 126 includes an IDT 122 and reflectors 124. The reflectors 124 are located at both sides of the IDT 122 in the X direction. The IDT 122 and the reflectors 124 are formed of a metal film 116 on the piezoelectric layer 114.

The IDT 122 includes a pair of comb-shaped electrodes 120 opposite to each other. The comb-shaped electrode 120 includes electrode fingers 118 and a bus bar 119 to which the electrode fingers 118 are coupled. The region where the electrode fingers 118 of the pair of the comb-shaped electrodes 120 overlap with each other is an overlap region 125. The length of the overlap region 125 in the Y direction is an aperture length. The pair of the comb-shaped electrodes 120 are provided so that the electrode fingers 118 of one of the comb-shaped electrodes 120 and the electrode fingers 118 of the other of the comb-shaped electrodes 120 are substantially alternately arranged in at least a part of the overlap region 125. The acoustic wave excited by the electrode fingers 118 in the overlap region 125 propagates mainly in the X direction. The pitch of the electrode fingers 118 of one of the pair of the comb-shaped electrodes 120 corresponds to the wavelength λ of the acoustic wave. When the pitch of the electrode fingers 118 (the pitch between the centers of the electrode fingers 118) is represented by D, the pitch of the electrode fingers 118 of one of the comb-shaped electrodes 120 is equal to two times the pitch D of the electrode fingers 118. The reflectors 124 reflect the acoustic wave (the surface acoustic wave) excited by the electrode fingers 118 of the IDT 122. Therefore, the acoustic wave is confined in the overlap region 125 of the IDT 122.

The piezoelectric layer 114 is, for example, a monocrystalline lithium tantalate (LiTaO$_3$) layer or a monocrystalline lithium niobate (LiNbO$_3$) layer, and is, for example, a rotated Y-cut X-propagation lithium tantalate layer or a rotated Y-cut X-propagation lithium niobate layer.

The support substrate 110 is, for example, a sapphire substrate, a silicon substrate, a spinel substrate, a quartz substrate, a crystal substrate, an alumina substrate, or a silicon carbide substrate. The sapphire substrate is a monocrystalline Al$_2$O$_3$ substrate, the silicon substrate is a monocrystalline or polycrystalline silicon substrate, the spinel substrate is a polycrystalline MgAl$_2$O$_4$ substrate, the quartz substrate is an amorphous SiO$_2$ substrate, the crystal substrate is a monocrystalline SiO$_2$ substrate, the silicon carbide substrate is a polycrystalline or monocrystalline SiC substrate. The linear expansion coefficient in the X direction of the support substrate 110 is less than the linear expansion coefficient in the X direction of the piezoelectric layer 114. This configuration reduces the temperature dependence of frequency of the acoustic wave resonator.

The intermediate layer 112 is formed of, for example, a temperature compensation film, and has a temperature coefficient of an elastic constant opposite in sign to the temperature coefficient of the elastic constant of the piezoelectric layer 114. For example, the piezoelectric layer 114 has a negative temperature coefficient of an elastic constant, while the intermediate layer 112 has a positive temperature coefficient of an elastic constant. The intermediate layer 112 is, for example, an insulating layer formed of, such as an additive-free silicon oxide (SiO$_2$) film or an SiO$_2$ film containing additive elements such as, but not limited to, fluorine, and is, for example, an amorphous layer. This configuration reduces the temperature coefficient of frequency of the acoustic wave resonator. When the intermediate layer 112 is formed of a silicon oxide film, the acoustic velocity of the bulk wave propagating through the intermediate layer 112 is lower than the acoustic velocity of the bulk wave propagating through the piezoelectric layer 114.

The intermediate layer 111 is a boundary layer or a high acoustic velocity layer, and the acoustic velocity of the bulk wave propagating through the intermediate layer 111 is higher than the acoustic velocity of the bulk wave propagating through the intermediate layer 112. Therefore, the acoustic wave is confined in the piezoelectric layer 114 and the intermediate layer 112. Furthermore, the acoustic velocity of the bulk wave propagating through the intermediate layer 111 is lower than the acoustic velocity of the bulk wave propagating through the support substrate 110. The intermediate layer 111 is, for example, polycrystalline or amorphous, and is an insulating layer formed of, such as, but not limited to, an aluminum oxide film, a silicon film, an aluminum nitride film, a silicon nitride film, or a silicon carbide film. A plurality of layers made of different materials may be provided as the intermediate layer 111.

The acoustic velocity of the bulk wave propagating through the bonding layer 113 is higher than the acoustic velocity of the bulk wave propagating through the intermediate layer 112. The bonding layer 113 is, for example, polycrystalline or amorphous, and is formed of, for example, an aluminum oxide film, a silicon film, an aluminum nitride film, a silicon nitride film, or a silicon carbide film.

The metal film 116 is a film mainly composed of, for example, aluminum (Al), copper (Cu), or molybdenum (Mo). An adhesion film such as a titanium (Ti) film or a chrome (Cr) film may be provided between the electrode finger 118 and the piezoelectric layer 114. The adhesion film is thinner than the electrode finger 118. An insulating film such as a silicon oxide film or a silicon nitride film may be provided so as to cover the electrode fingers 118. The insulating film functions as a protective film or a temperature compensation film.

The wavelength λ of the acoustic wave is, for example, 1 μm to 6 μm. When two electrode fingers 118 are defined as a pair, the number of pairs of the electrode fingers 118 is, for example, 20 to 300 pairs. The duty ratio of the IDT 122 is calculated by dividing the width of the electrode finger 118 by the pitch of the electrode fingers 118, and is, for example, 30% to 70%. The aperture length of the IDT 122 is, for example, 10λ to 50λ.

The IDT 122 excites the surface acoustic wave used as the primary mode, in the piezoelectric layer 114. At this time, the IDT 122 also excites an unnecessary wave such as a bulk wave. The energy of the surface acoustic wave exists in the section from the upper surface of the piezoelectric layer 114 to a depth of approximately 2λ (λ is the wavelength of the acoustic wave), in particular, the section from the upper surface of the piezoelectric layer 114 to a depth of λ. By contrast, the unnecessary wave such as a bulk wave exists in the section from the upper surface of the piezoelectric layer 114 to a depth of 10λ or greater. As the unnecessary wave propagates downward, the energy of the acoustic wave leaks, and the loss increases. On the other hand, when the bulk wave is reflected by the boundary face on the way to the support substrate 110, and returns to the IDT 122, this causes spurious emissions.

Figure 20A:
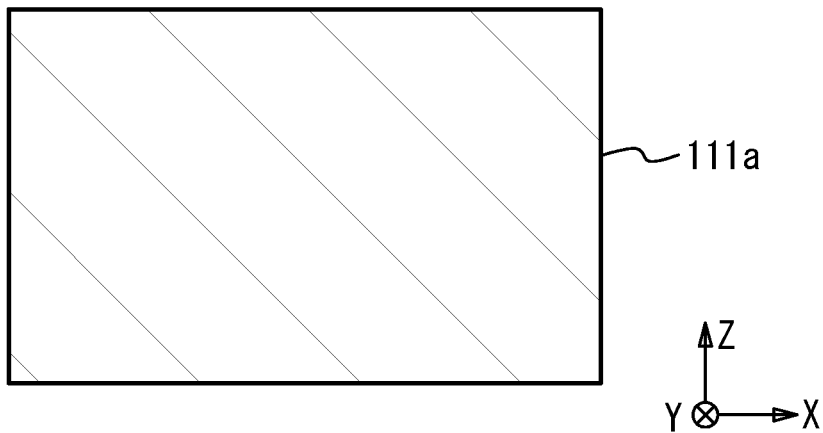
FIG. 20A to FIG. 20C are schematic cross-sectional views of intermediate layers in a third comparative example and the third embodiment.
Figure 20B:
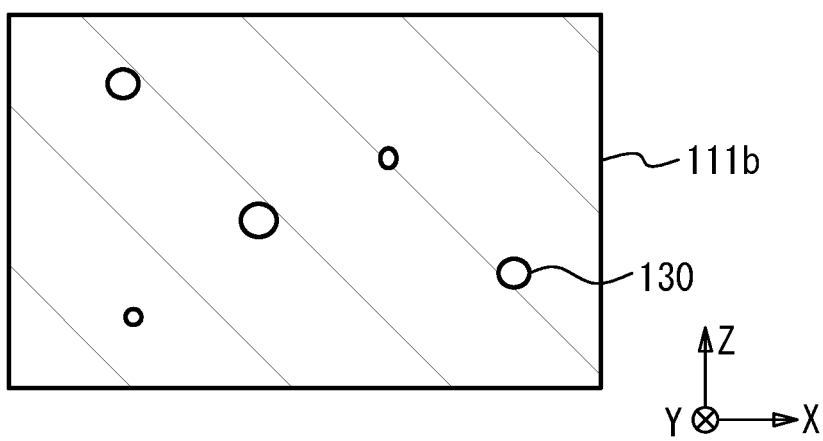
Figure 20C:
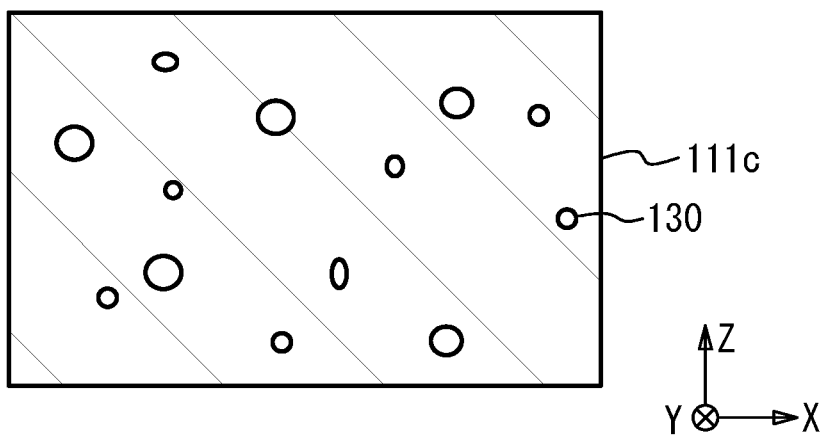

FIG. 20A to FIG. 21C are schematic cross-sectional views of the intermediate layer 111 in a third comparative example and the third embodiment. FIG. 20A and FIG. 21A correspond to the third comparative example, and FIG. 20B, FIG. 20C, FIG. 21B, and FIG. 21C correspond to the third embodiment. As illustrated in FIG. 20A, an intermediate layer 111a in the third comparative example is non-porous, and almost no pores are formed in the intermediate layer 111a. As illustrated in FIG. 20B, an intermediate layer 111b is porous, and pores 130 are formed in the intermediate layer 111b. As illustrated in FIG. 20C, an intermediate layer 111c is porous, and the intermediate layer 111c has more pores 130 than the intermediate layer 111b. That is, the porosity of the intermediate layer 111c is greater than the porosity of the intermediate layer 111b. The porosity is the ratio of the total volume of the pores 130 to the entire volume of each of the intermediate layers 111b and 111c.

Figure 21A:
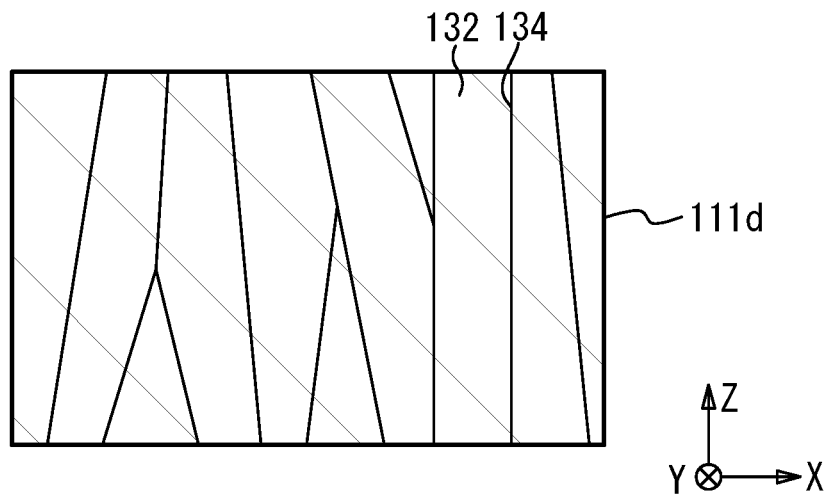
FIG. 21A to FIG. 21C are schematic cross-sectional views of the intermediate layers in the third comparative example and the third embodiment.
Figure 21B:
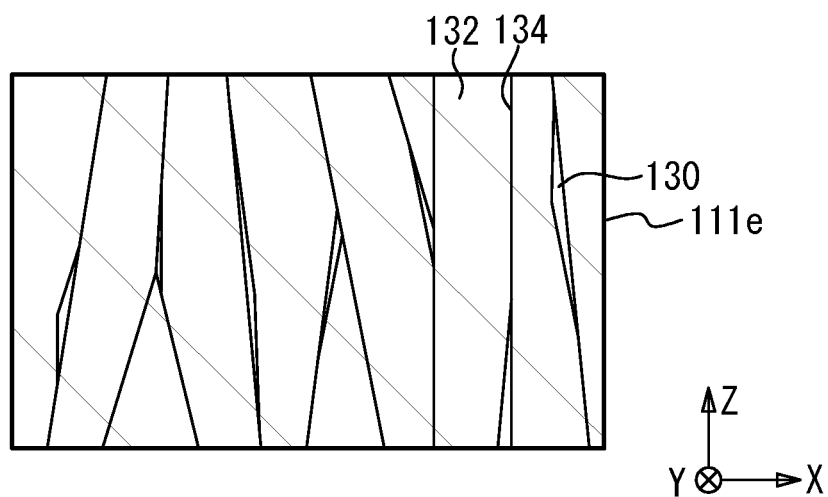
Figure 21C:
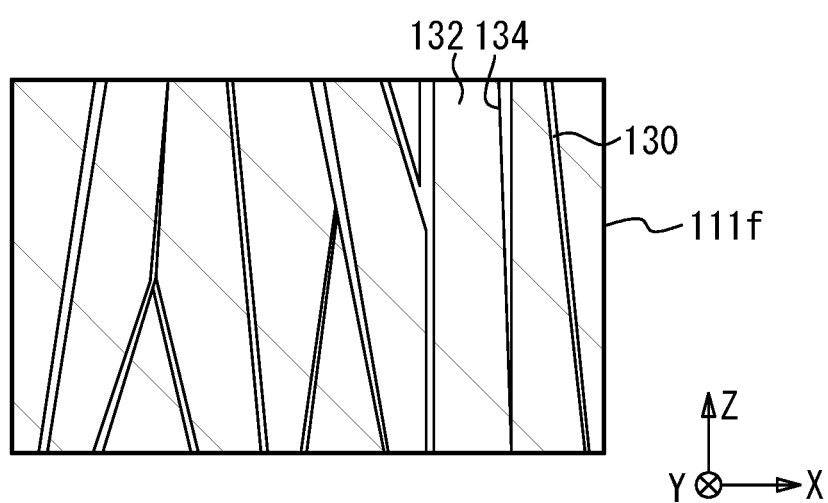

As illustrated in FIG. 21A, an intermediate layer 111d has a columnar structure having columnar crystal grains 132. The face between the crystal grains 132 is a grain boundary 134. The crystal grain 132 extends in the Z direction. That is, the width of the crystal grain 132 in the Z direction is greater than the width of the crystal grain 132 in the X direction. At least one of the crystal grains 132 is provided from the bottom surface to the top surface of the intermediate layer 111d. The columnar structure can be formed using a sputtering method. As illustrated in FIG. 21B, an intermediate layer 111e has the pores 130 formed in the grain boundary 134. The pores 130 extend along the grain boundary 134. Thus, the width of the pore 130 in the Z direction is greater than the width of the pore 130 in the X direction. As illustrated in FIG. 21C, the pores 130 larger than those of the intermediate layer 111e are formed in an intermediate layer 111f. The porosity of the intermediate layer 111f is greater than that of the intermediate layer 111e. According to Thornton Zone Model, when the intermediate layer 111 is formed by sputtering, the intermediate layer 111 having a porous columnar structure like the intermediate layers 111e and 111f is obtained by adjusting the substrate temperature to be low and the gas pressure to be high. Under the condition where the gas pressure is low, the non-porous intermediate layer 111d can be formed by sputtering. The porous intermediate layer 111e can be formed by adjusting the gas pressure to be high, and the porous intermediate layer 111f having a larger porosity can be formed by adjusting the gas pressure to be higher.

Figure 22A:
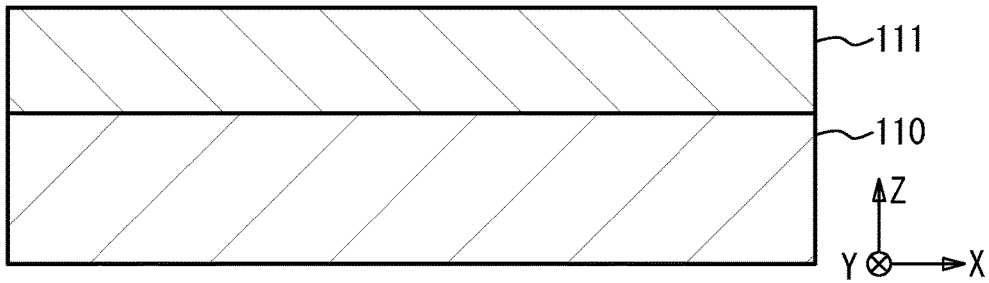
FIG. 22A to FIG. 22D are cross-sectional views illustrating a method of manufacturing the acoustic wave resonator in the third embodiment.
Figure 22B:
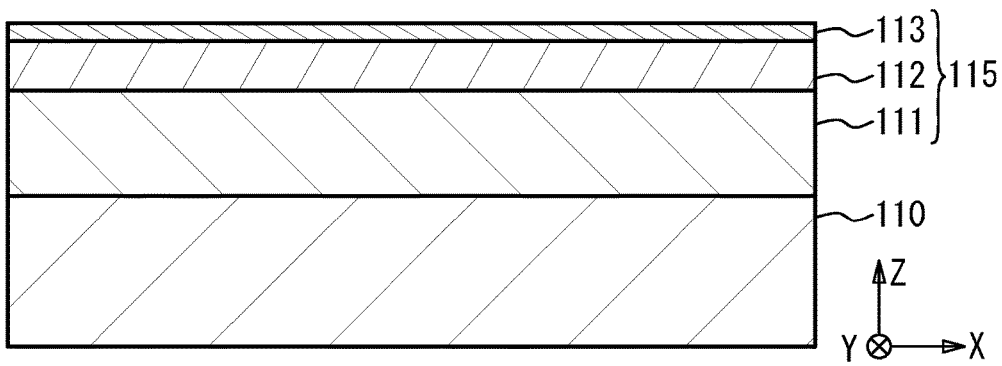

FIG. 22A to FIG. 22D are cross-sectional views illustrating a method of manufacturing the acoustic wave resonator in the third embodiment. As illustrated in FIG. 22A, the intermediate layer 111 is formed on the support substrate 110. By adjusting the gas pressure of noble gas (e.g., argon) to be high when the intermediate layer 111 is formed by sputtering, the pores 130 are formed in the intermediate layer 111 as illustrated in FIG. 21B and FIG. 21C. The intermediate layer 111 may be formed by vacuum evaporation or chemical vapor deposition (CVD). As illustrated in FIG. 22B, the intermediate layer 112 is formed on the intermediate layer 111, and the bonding layer 113 is formed on the intermediate layer 112. The intermediate layer 112 and the bonding layer 113 are formed by, for example, sputtering, vacuum evaporation, or CVD. The intermediate layers 111 and 112 and the bonding layer 113 form the multilayered film 115.

Figure 22C:
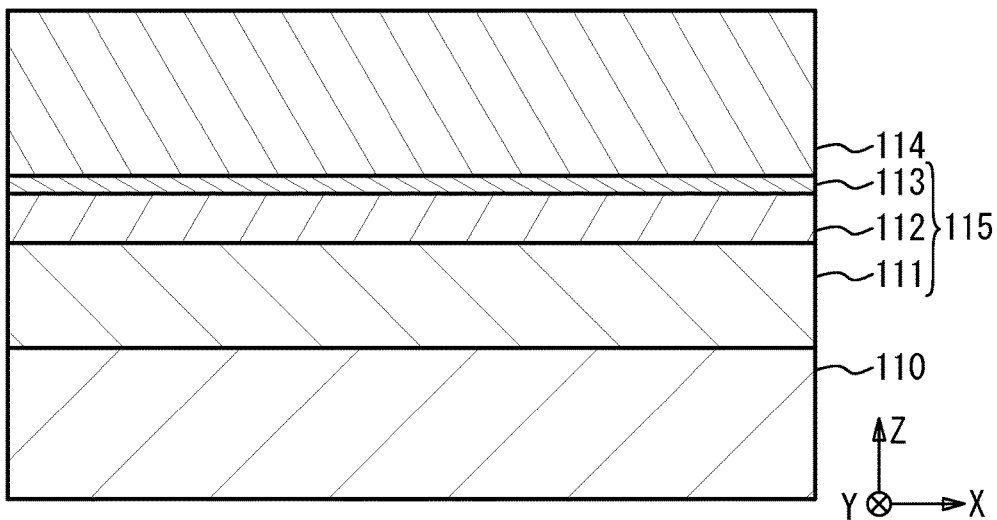
Figure 22D:
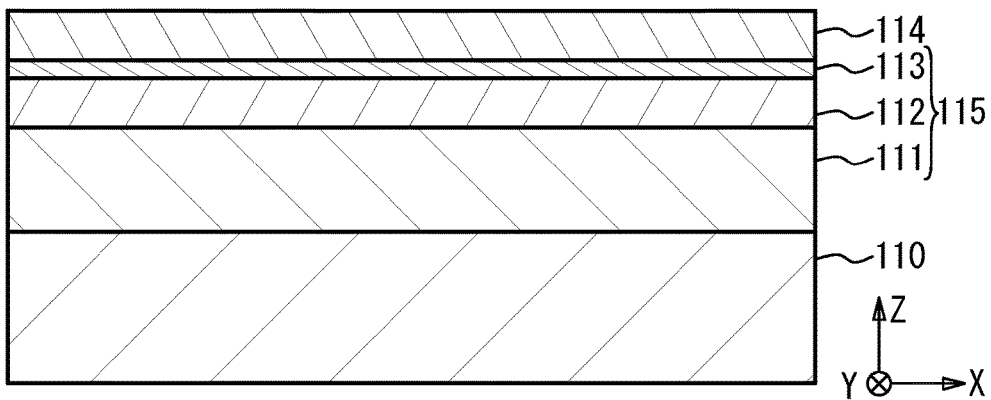

As illustrated in FIG. 22C, the piezoelectric layer 114 is bonded onto the bonding layer 113. The piezoelectric layer 114 is bonded using, for example, surface activation. As illustrated in FIG. 22D, the piezoelectric layer 114 is thinned by polishing or grinding the upper surface of the piezoelectric layer 114. The piezoelectric layer 114 is thinned by, for example, chemical mechanical polishing (CMP). Through the above processes, the wafer is completed. Thereafter, the metal film 116 is formed on the piezoelectric layer 114 by vacuum evaporation and liftoff. This process forms the acoustic wave resonator 126 on the piezoelectric layer 114. The metal film 116 may be formed by sputtering and etching.

Experiment

The amount of bow of a wafer was measured for different film forming conditions of the intermediate layer 111. The fabrication condition of the wafer is as follows.

Support substrate 110: Sapphire substrate with a thickness of 500 μm

Intermediate layer 111: Aluminum oxide layer with a thickness T11 of 7.2λ

Intermediate layer 112: Silicon oxide layer with a thickness T12 of 0.2λ

Piezoelectric layer 114: 42° rotated Y-cut X-propagation lithium tantalate layer with a thickness T14 of 0.3λ

Wavelength λ of the acoustic wave: 1.5 μm

Wafer size: 4 inches

Since the thickness T13 of the bonding layer 113 is approximately 10 nm, the stress due to the bonding layer 113 is substantially ignorable.

Samples A to C including the intermediate layers 111 formed under different film forming conditions were fabricated. The intermediate layer 111 was formed by sputtering using argon gas, and the gas pressure of the argon gas was adjusted to be A<B<C. The densities of the intermediate layers 111 formed under the same conditions as those of the samples A to C were measured. The density of the intermediate layer 111 of each sample is as follows.

Sample A: 3.17 g/cm$^3$
Sample B: 3.15 g/cm$^3$
Sample C: 3.08 g/cm$^3$

As apparent from above, as the gas pressure when the intermediate layer 111 is formed increases, the density of the intermediate layer 111 decreases. The intermediate layer 111 of the sample A is considered to have a columnar structure and be non-porous with almost no pores like the intermediate layer 111d illustrated in FIG. 21A. The intermediate layer 111 of the sample B is considered to have a columnar structure and be porous like the intermediate layer 111e illustrated in FIG. 21B. The intermediate layer 111 of the sample C is considered to have a columnar structure and be porous with a higher porosity than the intermediate layer 111 of the sample B like the intermediate layer 111f illustrated in FIG. 21C. Assuming that the intermediate layer 111 of the sample A is non-porous, and the differences among the densities of the samples A to C are determined only by the porosity, the porosities of the samples A, B, and C are 0%, approximately 1%, and approximately 3%, respectively.

The amount of bow of a wafer before bonding of the piezoelectric layer 114 (before forming of the bonding layer 113 in FIG. 22B) and the amount of bow of a wafer after bonding and thinning of the piezoelectric layer 114 (FIG. 22D) were measured. The amount of bow of the wafer was represented by a BOW. The BOW corresponds to the distance from the reference surface at the center of the wafer. When the BOW is positive, the wafer bows convexly, and the stress of the multilayered film 115 is a compression stress. When the BOW is negative, the wafer bows concavely, and the stress of the multilayered film 115 is a tensile stress.

Figure 23:
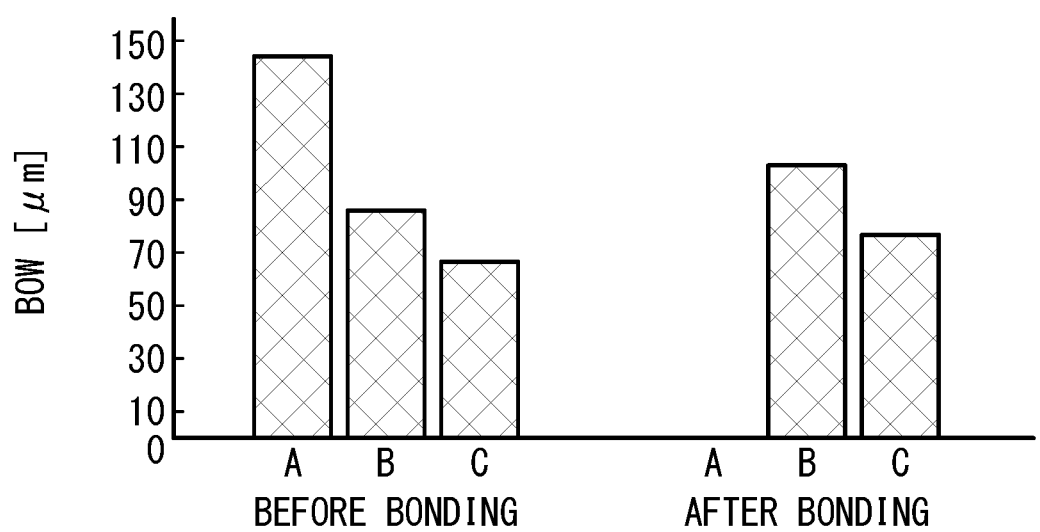
FIG. 23 illustrates the amount of bow of a wafer (a BOW) before and after bonding of each sample in an experiment.

FIG. 23 illustrates the amount of bow of the wafer (BOW) of each sample before and after bonding in the experiment. Since the amount of bow of the wafer was too large in the sample A after bonding, it was impossible to bond the piezoelectric layer 114. As illustrated in FIG. 23, before bonding, the BOW of the sample B is approximately 60% of the BOW of the sample A. The BOW of the sample C is equal to or less than 50% of the BOW of the sample A. After bonding, the BOW of the sample C is approximately 75% of the BOW of the sample B. As seen above, it is considered that the porous intermediate layer 111 reduces the internal stress due to the intermediate layer 111, resulting in the decrease in wafer bow.

In the third embodiment, the intermediate layer 111 (a first intermediate layer) is interposed between the support substrate 110 and the piezoelectric layer 114, and thicker than the piezoelectric layer 114. When the intermediate layer 111 is thick, the wafer bows due to the internal stress of the intermediate layer 111. Thus, the intermediate layer 111 is made to be porous. This structure reduces the internal stress of the intermediate layer 111, thereby reducing the wafer bow. When the thickness T11 of the intermediate layer 111 is equal to or greater than 1.5 times, equal to or greater than 2 times, or equal to or greater than 3 times the thickness T14 of the piezoelectric layer 114, the wafer is more likely to bow due to the internal stress of the intermediate layer 111. Therefore, the intermediate layer 111 is preferably made to be porous. To reduce the internal stress of the intermediate layer 111, the porosity of the intermediate layer 111 is preferably 0.1% or greater, more preferably 0.5% or greater, further preferably 1.0% or greater. When the porosity of the intermediate layer 111 is too large, the function as the intermediate layer 111 (for example, the function as a high acoustic velocity film) deteriorates. Therefore, the porosity of the intermediate layer 111 is preferably 20% or less, more preferably 10% or less, further preferably 5% or less.

Although it is not necessary to provide the intermediate layer 112, when the intermediate layer 111 is provided near the piezoelectric layer 114, the acoustic wave is scattered by the pores 130 and thereby the loss increases. Thus, the intermediate layer 112 (a second intermediate layer) is interposed between the intermediate layer 111 and the piezoelectric layer 114, and the porosity of the intermediate layer 112 is adjusted to be less than the porosity of the intermediate layer 111. This configuration causes the acoustic wave to be less likely to be scattered by the pores 130, and thereby reduces the loss. When the intermediate layer 112 is non-porous, the porosity is 0%. To reduce the loss, the porosity of the intermediate layer 112 is preferably 0.5% or less, more preferably 0.1% or less, and is preferably equal to or less than ½ of, more preferably equal to or less than ⅒ of the porosity of the intermediate layer 111. When the intermediate layer 112 is too thin, the loss increases even when the intermediate layer 112 is provided. Therefore, the thickness T12 of the intermediate layer 112 is preferably equal to or greater than ⅒ of, more preferably equal to or greater than ⅕ of, further preferably equal to or greater than ½ of the thickness T14 of the piezoelectric layer 114.

To reduce the wafer bow, the intermediate layer 111 is preferably thick. Therefore, the intermediate layer 111 is preferably thicker than the intermediate layer 112, and the thickness T11 of the intermediate layer 111 is preferably equal to or greater than 2 times, more preferably equal to or greater than 5 times the thickness T12 of the intermediate layer 112. In addition, the thickness T11 of the intermediate layer 111 is preferably equal to or greater than ¼ of, more preferably equal to or greater than ½ of, further preferably equal to or greater than ¾ of the thickness T15 of the multilayered film 115.

As illustrated in FIG. 21B and FIG. 21C, the intermediate layer 111 has a columnar structure, and the pores 130 are provided in the grain boundaries 134 between the crystal grains 132. Therefore, the porous intermediate layer 111 can be formed by sputtering.

The intermediate layer 112 has a temperature coefficient of an elastic constant opposite in sign to the temperature coefficient of the elastic constant of the piezoelectric layer 114. This configuration can reduce the temperature coefficient of frequency of the acoustic wave device. The intermediate layer 112 is mainly composed of silicon oxide as such materials. For example, the sum of the O concentration and the S1 concentration in the intermediate layer 112 is 50 atomic % or greater, or 80 atomic % or greater. The 0 concentration is, for example, 10 atomic % or greater, or 20 atomic % or greater, and the S1 concentration is, for example, 10 atomic % or greater, or 20 atomic % or greater. The acoustic velocity of the bulk wave propagating through the intermediate layer 111 is higher than the acoustic velocity of the bulk wave propagating through the intermediate layer 112. Therefore, the acoustic wave is confined in the piezoelectric layer 114 and the intermediate layer 112. The acoustic velocity of the bulk wave propagating through the intermediate layer 111 is preferably equal to or greater than 1.1 times, more preferably equal to or greater than 1.2 times the acoustic velocity of the bulk wave propagating through the intermediate layer 112. The acoustic velocity of the bulk wave propagating through the intermediate layer 111 is preferably equal to or less than 2.0 times, more preferably equal to or less than 1.5 times the acoustic velocity of the bulk wave propagating through the intermediate layer 112.

Although the acoustic velocity of the bulk wave propagating through the intermediate layer 112 may be higher than the acoustic velocity of the bulk wave propagating through the piezoelectric layer 114, the acoustic velocity of the bulk wave propagating through the intermediate layer 112 is preferably lower than the acoustic velocity of the bulk wave propagating through the piezoelectric layer 114. The acoustic velocity of the bulk wave propagating through the intermediate layer 112 is preferably equal to or less than 0.99 times the acoustic velocity of the bulk wave propagating through the piezoelectric layer 114. When the acoustic velocity of the bulk wave propagating through the intermediate layer 112 is too low, the acoustic wave is less likely to exist in the piezoelectric layer 114. Therefore, the acoustic velocity of the bulk wave propagating through the intermediate layer 112 is preferably equal to or greater than 0.9 times the acoustic velocity of the bulk wave propagating through the piezoelectric layer 114.

When most of the energy of the surface acoustic wave exists in the section from the surface of the piezoelectric layer 114 to a depth of 2λ, to confine the energy of the acoustic wave used as the primary mode in the piezoelectric layer 114 and the intermediate layer 112 and reduce the spurious response, the distance (T12+T13+T14) between a first surface, which is closer to the support substrate 110, of the intermediate layer 112 and a second surface, which is closer to the comb-shaped electrodes 120, of the piezoelectric layer 114 is preferably equal to or less than 4 times the average pitch D of the electrode fingers 118 (equal to or less than 2λ), more preferably equal to or less than 3 times the average pitch D of the electrode fingers 118 (equal to or less than 1.5λ). The average pitch D of the electrode fingers 118 can be calculated by dividing the width of the IDT 122 in the X direction by the number of the electrode fingers 118.

To cause the energy of the acoustic wave to exist in the intermediate layer 112, the thickness T14 of the piezoelectric layer 114 is preferably equal to or less than 2 times the average pitch D of the electrode fingers 118 (equal to or less than k), more preferably equal to or less than 1.2 times the average pitch D of the electrode fingers 118 (equal to or less than 0.6λ). When the piezoelectric layer 114 is too thin, the acoustic wave is not excited. Therefore, the thickness T14 of the piezoelectric layer 114 is preferably equal to or greater than 0.2 times the average pitch D of the electrode fingers 118 (equal to or greater than 0.1λ).

When the thickness T11 of the intermediate layer 111 is small, the spurious emission increases. Therefore, the thickness T11 of the intermediate layer 111 is preferably equal to or greater than 0.6 times the average pitch D of the electrode fingers 118 (equal to or greater than 0.3λ), more preferably equal to or greater than 1.4 times the average pitch D of the electrode fingers 118 (equal to or greater than 0.7λ), further preferably equal to or greater than 2 times the average pitch D of the electrode fingers 118 (equal to or greater than k), yet further preferably equal to or greater than 4 times the average pitch D of the electrode fingers 118 (equal to or greater than 2λ).

The thickness T13 of the bonding layer 113 is preferably 20 nm or less, more preferably 10 nm or less so as not to impair the functions of the piezoelectric layer 114 and the intermediate layer 112. In order not to impair the function as the bonding layer 113, the thickness T13 is preferably 1 nm or greater, more preferably 2 nm or greater. The bonding layer 113 may be omitted.

The piezoelectric layer 114 is mainly composed of lithium tantalate or lithium niobate and is monocrystalline, the intermediate layer 112 is mainly composed of silicon oxide and is polycrystalline or amorphous, the intermediate layer 111 and the bonding layer 113 are mainly composed of aluminum oxide and are polycrystalline or amorphous, and the support substrate 110 is a sapphire substrate or a silicon carbide substrate. When a certain film or layer is mainly composed of a certain material, this means that it is acceptable for the certain film or layer to contain impurities intentionally or unintentionally, and means that the certain film or layer contains 50 atomic % or greater of the certain material, or contains 80 atomic % or greater of the certain material.

When the acoustic wave excited by a pair of the comb-shaped electrodes 120 is mainly a shear horizontal (SH) wave, a bulk wave is more likely to be excited as an unnecessary wave. When the piezoelectric layer 114 is a 36° or greater and 48° or less rotated Y-cut lithium tantalate layer, an SH wave is excited. The acoustic wave mainly excited by the pair of the comb-shaped electrodes 120 is not limited to an SH wave, and may be, for example, a Lamb wave.

First Variation of the Third Embodiment

Figure 24A:
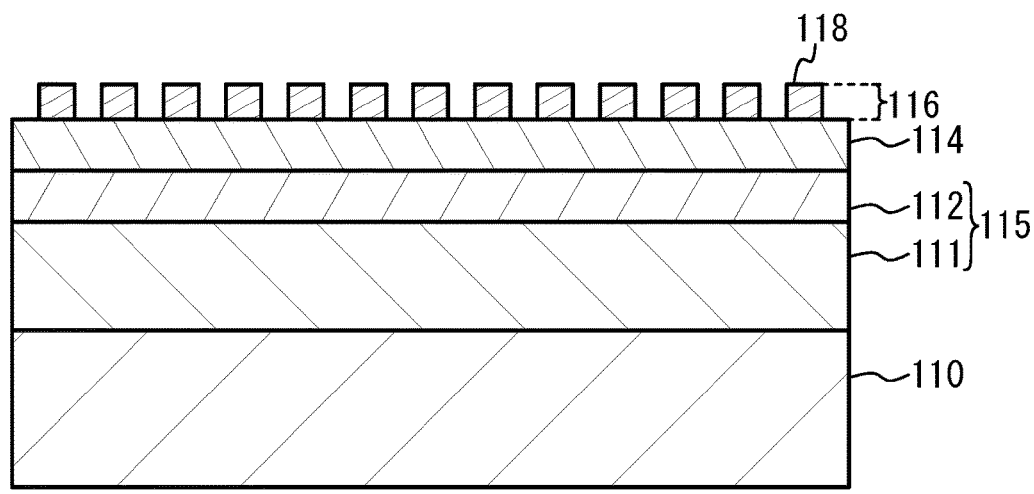
FIG. 24A and FIG. 24B are cross-sectional views of acoustic wave resonators in accordance with first and second variations of the third embodiment.

FIG. 24A is a cross-sectional view of an acoustic wave resonator in accordance with a first variation of the third embodiment. As illustrated in FIG. 24A, no bonding layer 113 is provided in the first variation of the third embodiment. The intermediate layer 111 is thicker than the intermediate layer 112, and is thicker than the piezoelectric layer 114. The intermediate layer 111 is porous, and the intermediate layer 112 is non-porous. As an example, the intermediate layer 111 is mainly composed of aluminum oxide, and the intermediate layer 112 is mainly composed of silicon oxide. As seen above, the main component of the intermediate layer 111 may be different from the main component of the intermediate layer 112. As another example, the intermediate layers 111 and 112 may be mainly composed of silicon oxide. As seen above, the main components of the intermediate layers 111 and 112 may be the same. Other structures are the same as those of the third embodiment illustrated in FIG. 19A and FIG. 19B, and the description thereof is thus omitted.

When the main component of the intermediate layer 112 is the same as the main component of the intermediate layer 111, for example, when the intermediate layers 111 and 112 are both mainly composed of silicon oxide or aluminum oxide, the density of the intermediate layer 112 is greater than the density of the intermediate layer 111. This configuration reduces the wafer bow due to the internal stress of the intermediate layer 111. When the densities of the intermediate layers 111 and 112 are represented by $\rho12$ and $\rho11$, respectively, $(\rho12-\rho11)/\rho11\times100[\%]$ is preferably 0.1% or greater, more preferably 0.5% or greater, further preferably 1.0% or greater. When the density of the intermediate layer 111 is too small, the function as the intermediate layer 111 (for example, the function as a high acoustic velocity film) deteriorates. Thus, $(\rho12-\rho11)/\rho11\times100[\%]$ is preferably 20% or less, more preferably 10% or less, further preferably 5% or less.

Second Variation of the Third Embodiment

Figure 24B:
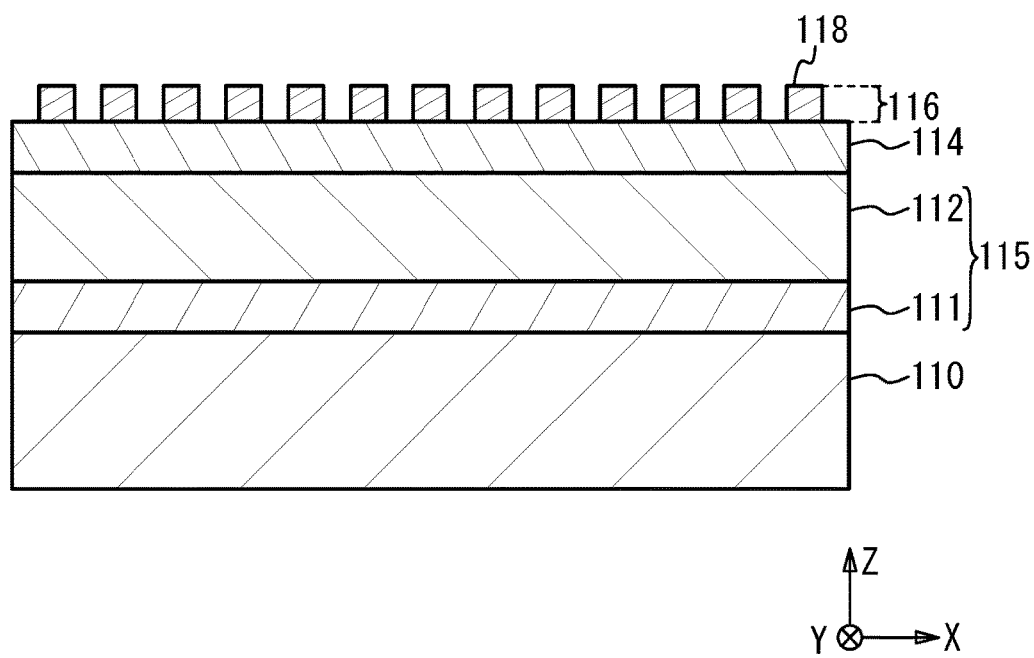

FIG. 24B is a cross-sectional view of an acoustic wave resonator in accordance with a second variation of the third embodiment. As illustrated in FIG. 24B, in the second variation of the third embodiment, the intermediate layer 111 is thinner than the intermediate layer 112, and is thicker than the piezoelectric layer 114. The intermediate layer 111 is porous, and the intermediate layer 112 is non-porous. Other structures are the same as those of the first variation of the third embodiment, and the description thereof is thus omitted.

Third Variation of the Third Embodiment

Figure 25A:
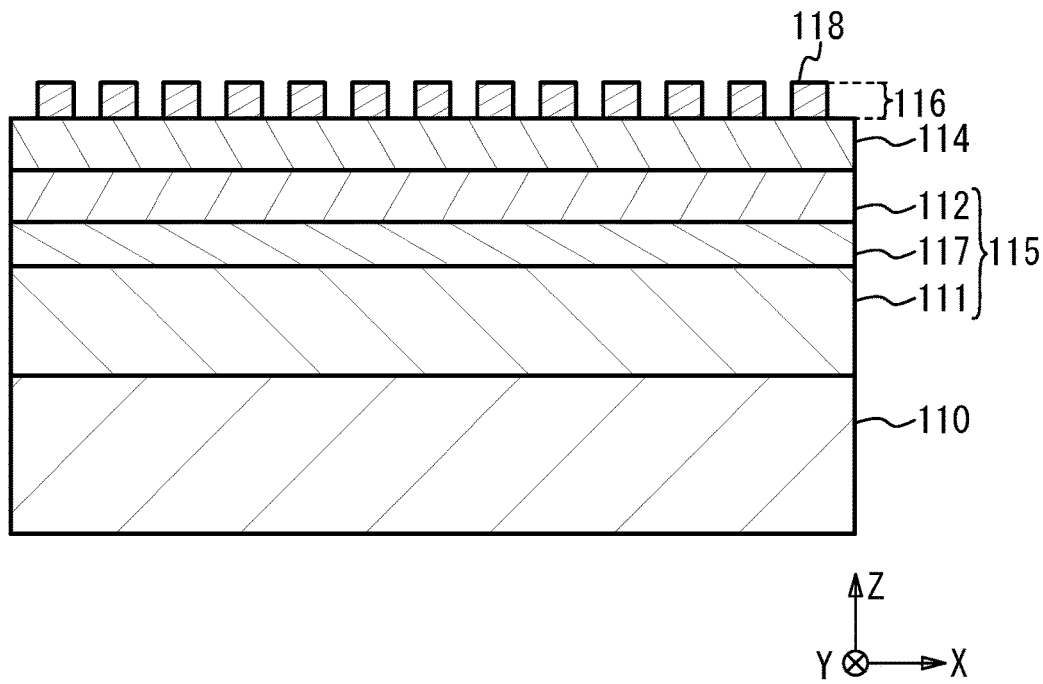
FIG. 25A and FIG. 25B are cross-sectional views of acoustic wave resonators in accordance with third and fourth variations of the third embodiment.

FIG. 25A is a cross-sectional view of an acoustic wave resonator in accordance with a third variation of the third embodiment. As illustrated in FIG. 25A, in the third variation of the third embodiment, an intermediate layer 117 is interposed between the intermediate layers 111 and 112. The intermediate layer 112 is non-porous. The intermediate layer 117 may be porous or non-porous. When the intermediate layer 117 is porous, the intermediate layer 111 may be porous or non-porous. When the intermediate layers 111 and 117 are porous, the porosity of the intermediate layer 117 may be the same as or different from the porosity of the intermediate layer 111. For example, the porosity of the intermediate layer 117 is less than the porosity of the intermediate layer 111. The main component of the intermediate layer 117 may be the same as the main component of the intermediate layer 111, may be the same as the main component of the intermediate layer 112, or may be different from each of the main components of the intermediate layers 111 and 112. The intermediate layer 117 may be thinner or thicker than the intermediate layer 111.

As an example, the intermediate layers 111 and 117 are mainly composed of aluminum oxide, and the intermediate layer 112 is mainly composed of silicon oxide. The intermediate layers 111 and 117 are porous, the intermediate layer 112 is non-porous, and the porosity of the intermediate layer 117 is less than the porosity of the intermediate layer 111. As another example, the intermediate layer 111 is mainly composed of aluminum oxide, and the intermediate layers 117 and 112 are mainly composed of silicon oxide. The intermediate layer 111 is non-porous or porous, the intermediate layer 117 is porous, and the intermediate layer 112 is non-porous. Other structures are the same as those of the first variation of the third embodiment, and the description thereof is thus omitted.

Fourth Variation of the Third Embodiment

Figure 25B:
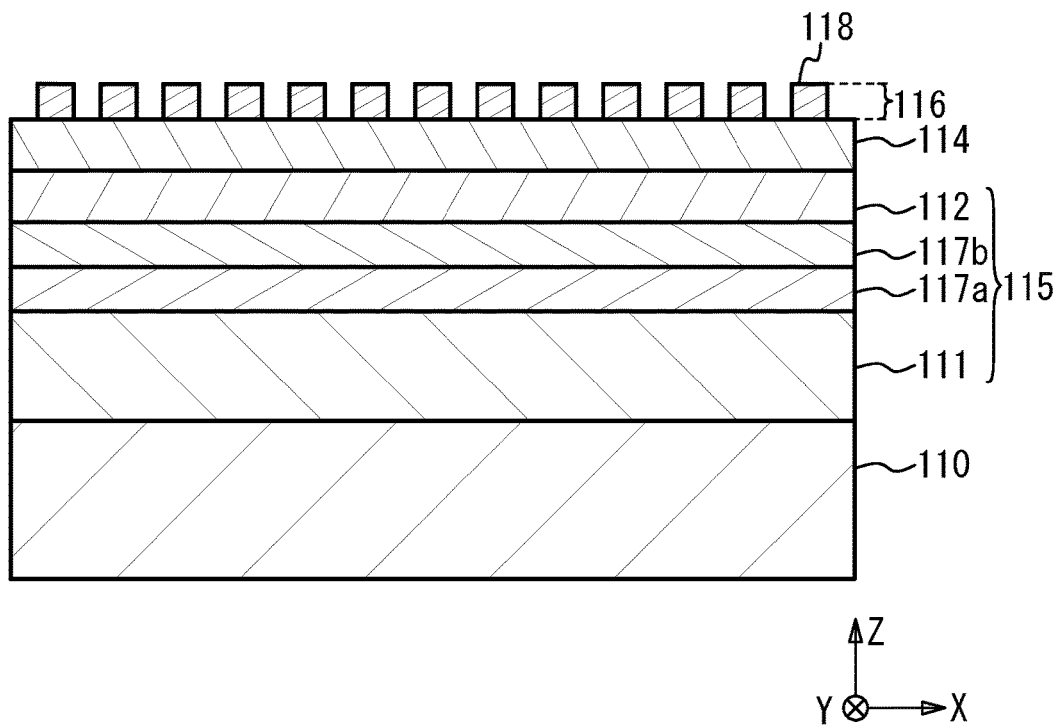

FIG. 25B is a cross-sectional view of an acoustic wave resonator in accordance with a fourth variation of the third embodiment. As illustrated in FIG. 25B, in the fourth variation of the third embodiment, intermediate layers 117a and 117b are provided between the intermediate layers 111 and 112. The intermediate layer 112 is non-porous. The intermediate layers 117a and 117b may be porous or non-porous. When the intermediate layer 117a or 117b is porous, the intermediate layer 111 may be porous or non-porous. When at least two layers of the intermediate layers 111, 117a, and 117b are porous, the porosities of the at least two layers may be the same or different from each other. The main components of the intermediate layers 117a and 117b may be the same as the main component of the intermediate layer 111, may be the same as the main component of the intermediate layer 112, or may be different from each of the main components of the intermediate layers 111 and 112. The intermediate layers 117a and 117b may be thinner or thicker than the intermediate layer 111.

As an example, the intermediate layers 111, 117a, and 117b are mainly composed of aluminum oxide, and the intermediate layer 112 is mainly composed of silicon oxide. The intermediate layers 111 and 117a are porous, the intermediate layers 117b and 112 are non-porous, and the porosity of the intermediate layer 117a is less than the porosity of the intermediate layer 111. As another example, the intermediate layers 111 and 117a are mainly composed of aluminum oxide, and the intermediate layers 117b and 112 are mainly composed of silicon oxide. The intermediate layers 111, 117a, and 117b are porous, and the porosity of the intermediate layer 117a is less than the porosity of the intermediate layer 111. The intermediate layer 112 is non-porous. Other structures are the same as those of the first variation of the third embodiment, and the description thereof is thus omitted.

When the porosity of the intermediate layer close to the piezoelectric layer 114 is large, the acoustic wave is scattered by pores, and the loss increases. Thus, when three or more intermediate layers are provided as in the third and fourth variations of the third embodiment, the porosity of the intermediate layer closer to the piezoelectric layer 114 is preferably made to be smaller. For example, in FIG. 25B of the fourth variation of the third embodiment, the porosity of the intermediate layer 111>the porosity of the intermediate layer 117a>the porosity of the intermediate layer 117b>the porosity of the intermediate layer 112.

Although the embodiments of the present invention have been described in detail, it is to be understood that the various change, substitutions, and alterations could be made hereto without departing from the spirit and scope of the invention.

What is claimed is:

1. An acoustic wave device comprising:
a support substrate:
a piezoelectric layer provided over the support substrate;
a pair of comb-shaped electrodes disposed on the piezoelectric layer, each of the pair of comb-shaped electrodes including electrode fingers that excite an acoustic wave;
a temperature compensation film interposed between the support substrate and the piezoelectric layer and having a temperature coefficient of an elastic constant opposite in sign to a temperature coefficient of an elastic constant of the piezoelectric layer;
a boundary layer interposed between the support substrate and the temperature compensation film, an acoustic velocity of a bulk wave propagating through the boundary layer being higher than an acoustic velocity of a bulk wave propagating through the temperature compensation film and being lower than an acoustic velocity of a bulk wave propagating through the support substrate; and
an intermediate layer interposed between the support substrate and the boundary layer and having a Q factor less than a Q factor of the boundary layer.

2. The acoustic wave device according to claim 1, wherein a thickness of the intermediate layer is equal to or greater than 0.1 times an average pitch of the electrode fingers of the pair of comb-shaped electrodes, and the Q factor of the intermediate layer is equal to or less than 0.2 times the Q factor of the boundary layer.

3. The acoustic wave device according to claim 1, wherein a thickness of the boundary layer is equal to or greater than 2.2 times an average pitch of the electrode fingers of the pair of comb-shaped electrodes.

4. The acoustic wave device according to claim 1, wherein a distance between a first surface, which is closer to the support substrate, of the temperature compensation film and a second surface, which is closer to the pair of comb-shaped electrodes, of the piezoelectric layer is equal to or less than 4 times an average pitch of the electrode fingers of the pair of comb-shaped electrodes.

5. The acoustic wave device according to claim 1, wherein the boundary layer is in contact with the intermediate layer.

6. The acoustic wave device according to claim 1, wherein a thickness of the boundary layer is equal to or less than 10 times an average pitch of the electrode fingers of the pair of comb-shaped electrodes.

7. The acoustic wave device according to claim 1, wherein a main component of the boundary layer is the same as a main component of the intermediate layer.

8. The acoustic wave device according to claim 1, wherein the piezoelectric layer is mainly composed of lithium tantalite or lithium niobate and is monocrystalline, the temperature compensation film is mainly composed of silicon oxide and is polycrystalline or amorphous, the boundary layer is mainly composed of aluminum oxide and is polycrystalline or amorphous, and the intermediate layer is mainly composed of aluminum oxide and is polycrystalline or amorphous.

9. A filter comprising:
the acoustic wave device according to claim 1.

10. A multiplexer comprising:
the filter according to claim 9.

* * * * *